(12) United States Patent
Tsunogae et al.

(10) Patent No.: US 7,238,405 B2
(45) Date of Patent: Jul. 3, 2007

(54) INSULATING MATERIAL CONTAINING CYCLOOLEFIN POLYMER

(75) Inventors: Yasuo Tsunogae, Kanagawa (JP); Yasuhiro Wakizaka, Kanagawa (JP); Junji Kodemura, Kanagawa (JP); Tohru Hosaka, Kanagawa (JP)

(73) Assignee: Nippon Zeon Company, Ltd., Tokyo (JP)

( * ) Notice: Subject to any disclaimer, the term of this patent is extended or adjusted under 35 U.S.C. 154(b) by 469 days.

(21) Appl. No.: 10/772,181

(22) Filed: Feb. 4, 2004

(65) Prior Publication Data

US 2004/0157039 A1 Aug. 12, 2004

Related U.S. Application Data

(62) Division of application No. 09/445,310, filed as application No. PCT/JP98/02529 on Jun. 8, 1998, now Pat. No. 6,713,154.

(30) Foreign Application Priority Data

| Jun. 6, 1997 | (JP) | ............................. 1997-165158 |
| Jul. 22, 1997 | (JP) | ............................. 1997-211266 |
| Aug. 19, 1997 | (JP) | ............................. 1997-237648 |

(51) Int. Cl.
*B32B 27/00* (2006.01)
*C08F 8/00* (2006.01)

(52) U.S. Cl. ................... 428/137; 428/220; 428/476.3; 427/98.3; 427/99.4; 427/385.5; 156/307.1; 524/553; 525/285; 525/289; 525/326.1; 525/387; 526/281

(58) Field of Classification Search ................ 524/553; 428/137, 220, 476.3; 156/307.1; 427/98.3, 427/99.4, 385.5; 525/285, 289, 326.1, 387; 526/281
See application file for complete search history.

(56) References Cited

U.S. PATENT DOCUMENTS

| 4,307,008 A | 12/1981 | Tsuchiya et al. |
| 5,117,327 A | 5/1992 | Asrar et al. |
| 5,468,819 A | 11/1995 | Goodall et al. |
| 5,783,639 A * | 7/1998 | Kataoka et al. ............. 525/286 |
| 5,895,800 A | 4/1999 | Kataoka et al. |

FOREIGN PATENT DOCUMENTS

| EP | 0430026 | 6/1991 |
| JP | 62-027412 | 2/1987 |
| JP | 62-29191 | 2/1987 |
| JP | 62-034924 | 2/1987 |
| JP | 64-22092 | 1/1989 |
| JP | 64-66216 | 3/1989 |
| JP | 3-036224 | 2/1990 |
| JP | 2-133406 | 5/1990 |
| JP | 2-173112 | 7/1990 |
| JP | 2-305814 | 12/1990 |
| JP | 3-072512 | 3/1991 |
| JP | 3-074409 | 3/1991 |
| JP | 4-077520 | 3/1992 |
| JP | 4-363312 | 12/1992 |
| JP | 5-271356 | 10/1993 |
| JP | 5-320268 | 12/1993 |
| JP | 6-172423 | 6/1994 |
| JP | 6-271724 | 9/1994 |
| JP | 7-170070 | 7/1995 |
| JP | 7-258318 | 10/1995 |
| JP | 7268172 | 10/1995 |
| JP | 7-292020 | 11/1995 |
| JP | 8-041167 | 2/1996 |
| JP | 8-073715 | 3/1996 |
| JP | 8-148837 | 6/1996 |
| JP | 8-181458 | 7/1996 |
| JP | 8-236943 | 9/1996 |
| JP | 9-001728 | 1/1997 |

OTHER PUBLICATIONS

Method for Forming Minute Pattern of Photosensitive Polyimide and Application Thereof to MCM Use; Collection of Lecture Papers in Seventh Science Lecture Meeting of Society of Printed Circuit Board, pp. 39-40.
Kiyoshi Takagi, "Trend of MCM Assembly Boards in Recent Years," *Journal of Circuit Assembly Society*, vol. 11, No. 5, 1996.

* cited by examiner

*Primary Examiner*—Fred Teskin
(74) *Attorney, Agent, or Firm*—Dinsmore & Shohl LLP

(57) ABSTRACT

An insulating material comprising a cycloolefin polymer, specifically, an interlayer insulating material for a high-density assembly board having interlayer-connecting via holes at most 200 μm in diameter, comprising a cycloolefin polymer containing at least 50 mol % of a repeating unit derived from a cycloolefin monomer; a dry film formed from a curable resin composition comprising a polymer having a number average molecular weight within a range of 1,000 to 1,000,000 as measured by gel permeation chromatography, and a hardener; and a resin-attached metal foil obtained by forming a film of a cycloolefin polymer on one side of a metal foil. Laminates, multi-layer laminates and build-up multi-layer laminates making use of these materials, and production processes thereof.

20 Claims, No Drawings

INSULATING MATERIAL CONTAINING CYCLOOLEFIN POLYMER

RELATED APPLICATIONS

The present application is a divisional of application Ser. No. 09/445,310 filed Dec. 6, 1999, now U.S. Pat. No. 6,713,154, which is a 371 of PCT/JP98/02529 filed Jun. 8, 1998.

TECHNICAL FIELD

The present invention relates to insulating materials containing a cycloolefin polymer and their uses. More particularly, the present invention relates to high-density assembly boards which are excellent in the ability to form minute interlayer-connecting via holes and also excellent in heat resistance, interlayer insulating materials suitable for use in the production of such a high-density assembly board, and packages of semiconductor parts produced by using the high-density assembly board. The present invention also relates to dry films excellent in processability, adhesion property and productivity, laminates making use of such a dry film and production processes thereof. The present invention further relates to resin-attached metal foils with a film of a cycloolefin polymer formed on one side of a metal foil, laminates obtained by laminating such a resin-attached metal foil, and a production process of a build-up multi-layer laminate using such a laminate, and more particularly to resin-attached metal foils and laminates, which are excellent in chemical resistance, adhesion property and reliability, and a production process thereof.

BACKGROUND ART

With the rapid advancement of advanced information-oriented society in recent years, there is a strong demand for the enhancement of throughput capacity of information processing apparatus, i.e., the speeding up. In addition, their miniaturization and weight saving are required so as to be portable.

Of these requirements, in order to achieve the speeding up of the information processing, it is effective to make the interconnected wiring of passive parts and active parts such as LSI, memory and so as short as possible so as to make wiring density high. This technique is also effective for the miniaturization and weight saving.

Printed wiring boards by which the width and pitch (line and space; L/S) of wiring are make small to make the high-density assembly of electronic parts such as LSI chips possible have heretofore been known as high-density assembly boards. In this case, in order to make the great reduction of the wiring pitch (L/S) possible, it is necessary to form minute interlayer-connecting via holes having a diameter of at most 200 μm, which is far smaller than those used in production techniques for general printed wiring boards.

It is difficult to form the interlayer-connecting via holes at most 200 μm in diameter by the drilling used in the formation of via holes in the conventional printed boards. It is hence necessary to use photolithography in which photosensitivity is imparted to an insulating material to conduct ultraviolet exposure, or etching by a laser. Therefore, as properties required of the insulating material, it is important to permit easily imparting photosensitivity and heightening the aspect ratio (thickness of an insulating film/connection via diameter) of via holes by the photolithography or etching by a laser to easily form minute via holes.

An insulating material used in an interlayer insulating film of a high-density board is particularly required to have high heat resistance that can withstand heat generated by high-density assembly and high-density mounting processes of electronic parts, and low water absorption property for ensuring insulation reliability in a narrow wiring pitch and a thin insulating layer. In addition, since speeding up and the use of high frequency are required in the field in which these high-density assembly boards are used, it is desirable for the insulating material to have excellent dielectric properties such as low dielectric constant and low dielectric loss tangent.

As the insulating material for the interlayer insulating film, it has heretofore been disclosed in, for example, "Method for Forming Minute Pattern of Photosensitive polyimide and Application thereof to MCM Use; Collection of Lecture Papers in Seventh Science Lecture Meeting of Society of Printed Circuit Board, pp. 39–40" to use polyimide to which photosensitivity has been imparted. However, the photosensitive polyimide is excellent in heat resistance and dielectric properties, but the bottom of its film is hard to cure upon ultraviolet exposure, and so it has involved a problem that the wall surface of a via hole formed therein is easy to swell by development. Even when non-photosensitive polyimide is processed by a laser, there has been a problem that the formation of a minute via hole is difficult by reason of too high absorption of laser or difficulty of being decomposed. In addition, since the polyimide resin has a high water absorptivity, its dielectric properties are greatly deteriorated, and insulation reliability is lowered by moisture absorption in high-temperature and high-humidity conditions in particular. Further, the polyimide resin undergoes bubbling of water in the resin under high-temperature conditions in solder mount or the like. Such bubbling has formed the cause of blister and cracking and hence become a great problem.

For example, Japanese Patent Application Laid-Open Nos. 170070/1995, 41167/1996 and 148837/1996 disclose a technique in which a material obtained by imparting photosensitivity to such a bisphenol A type epoxy resin as used in general printed wiring boards is used. However, this photosensitive epoxy resin has been subjected to acryl modification for the purpose of imparting the photosensitivity and hence has involved a problem that the dielectric properties of the resulting board are greatly deteriorated. In addition, the photosensitive epoxy resin has also involved the same problem as in the photosensitive polyimide as to the formation of the via hole and a problem that smear tends to occur even in the case of the laser processing by heat curing.

Japanese Patent Application Laid-Open Nos. 181458/1996 and 236943/1996 disclose a technique in which a bismaleimide.triazine resin (BT resin) or thermosetting type poly(phenylene ether) (PPE) resin is used as an interlayer insulating material. Both resins are excellent in heat resistance and dielectric properties but have involved a problem that the formation of a via hole is difficult, since it is difficult to impart photosensitivity to the resins. In the case of the bismaleimide.triazine resin in particular, there has been a problem that insulation reliability is lowered in an accelerated durability test at high temperature and high humidity because of its high water absorptivity, and so the resin is poor in durability.

By the way, a thermoplastic norbornene resin which is a cycloolefin resin is known to be a material having excellent dielectric properties and low water absorption property and exhibit excellent electrical properties when it is used in a printed wiring board. For example, Japanese Patent Application Laid-Open No. 29191/1987 discloses a process for producing a circuit board by impregnating a glass cloth with a thermoplastic norbornene resin obtained by addition copolymerization of a norbornene monomer and ethylene and then curing the resin with a peroxide, while Japanese Patent Application Laid-Open No. 27412/1987 discloses a method in which an epoxy group-containing thermoplastic norbornene resin obtained by graft-reacting an addition copolymer of ethylene and a norbornene monomer with allyl glycidyl ether is used as an insulating material. However, these process and method have involved a problem that the glass transition temperature of each resin is low, and its heat resistance is insufficient, because the content of the norbornene monomer unit is low, and so an interlayer insulating film undergoes deformation or softening upon high-density packaging of semiconductor parts, and yield of the packaging is lowered.

As described above, any insulating material satisfying all the required properties of the ability to form minute via holes, high heat resistance, low water absorption property and excellent dielectric properties has heretofore not been proposed.

In the requirements of high-density assembly of an electronic circuit and speeding up of a digital circuit, said both circuits being used in computers and information communication, a high-density region which cannot be accommodated by the conventional plated through-hole multi-layer board produced from a double-sided copper-clad laminate is required in a field of printed wiring boards used in these circuits.

Therefore, attention has been paid to a build-up process in which an interlayer-connecting via hole is formed in each wiring layer to successively connect wiring layers. The build-up process includes a photo type using a photosensitive insulating material and a laser type using a thermosetting insulating material. It has heretofore been mainly conducted to successively laminate layers while applying a varnish with any of these insulating materials dissolved in a solvent to a substrate, curing the varnish, forming via holes and forming a wiring pattern.

However, a process in which a curable resin such as an epoxy resin used in the above-described photosensitive or thermosetting insulating material is formed into a film in advance, and the film is laminated on a substrate in a tack-free and semi-cured dry film state (B-stage state) has been already put to practical use in recent years for the purpose of simplifying such complicated processes as described above and enhancing handling property.

However, the conventional dry film can simplify the process in the lamination on the substrate compared with the coating of the solution, but has involved a problem that a process for forming the film is complicated for reasons of semi-curing a liquid epoxy monomer in advance to form the tack-free film, and after all the dry film is not related to the simplification of the whole process. In addition, such a dry film of the semi-cured state tends to be affected by temperature, light and the like and it is hence necessary to take care to store or handle the film.

Further, in the field of printed wiring boards of electronic apparatus used in computers and information communication, it is of urgent necessity to establish a build-up laminating process capable of forming wiring (wiring pitch, interlayer-connecting via holes) of high density in a region which has been impossible of achievement by the conventional plated through-hole method by drilling. A process in which a build-up multi-layer laminate is produced while applying a thermosetting poly(phenylene ether) resin excellent in heat resistance, low moisture absorption property and dielectric properties and the like to a copper foil and heat-setting the resin by heating and pressing has heretofore been disclosed in Japanese Patent Application Laid-Open No. 1728/1997. However, the resistance to chemicals such as acids and alkalis of the thermosetting poly(phenylene ether) resin is not sufficient though it is excellent. Therefore, the surface of an insulating layer is slightly dissolved upon etching of the copper foil or a chemical treatment for removal of smear after the formation of interlayer-connecting via holes in the production of the build-up laminate, so that the anchor effect of a rough surface is too lowered to sufficiently ensure adhesion property to a plating layer and adhesion property between the insulating layers. There has hence been a problem that reliability as a laminated board is greatly lowered. In order to solve this problem, a surface roughening treatment must be conducted again before the formation of the plating layer, and so the process becomes complicated. Accordingly, it has heretofore been difficult to provide a build-up multi-layer laminate which can be produced by a simple process and has sufficient reliability even when a material satisfying the requirements of high heat resistance and low dielectric properties is used.

DISCLOSURE OF THE INVENTION

It is an object of the present invention to provide an interlayer insulating material for high-density assembly boards such as bare chip mounting, which has excellent properties in the ability to form minute via holes, heat resistance, low water absorption property and dielectric properties, a high-density assembly board having an interlayer insulating film formed with such an interlayer insulating material, and a semiconductor package using the high-density assembly board.

Another object of the present invention is to provide a dry film excellent in shelf stability, productivity, and forming and processing ability, and a laminate making use of the dry film.

A further object of the present invention is to provide a process for efficiently produce a build-up multi-layer laminate which is excellent in chemical resistance and can ensure sufficient adhesion property and so can achieve high reliability, and materials to be used in the process.

The present inventors have carried out an extensive investigation with a view toward solving the above-described problems. As a result, it has been found that when an insulating material comprising a cycloolefin polymer containing at least 50 mol % of a repeating unit derived from a cycloolefin monomer is used, an interlayer insulating film which can withstand heat generated by high-density assembly and high-density mounting such as bare chip mounting can be provided. In this interlayer insulating film, interlayer-connecting via holes at most 200 µm in diameter can be formed with ease. The cycloolefin polymer has a glass transition temperature of generally at least 100° C. and is hence excellent in heat resistance.

It has also been found that the cycloolefin polymer is a material excellent in the ability to form minute via holes for reasons of the fact that (1) it is excellent in light transmittance, and so a film can be efficiently cured up to the bottom thereof upon the formation of via holes by photo-setting, (2) it is excellent in chemical resistance, and so the wall surface of each via hole is hard to swell, and (3) it is easy to control sensitivity upon laser processing because absorption is little in the polymer itself, and the polymer is easy to be decomposed to produce no smear. The cycloolefin polymer is best in low water absorption property and dielectric properties compared with the conventional materials, and deterioration of these properties is suppressed to a very small extent because photosensitivity and adhesion property can be imparted by introducing a polar group, thereby providing a high-density assembly board extremely excellent in insulation reliability, speeding up and high-frequency characteristics.

The present inventors have also carried out an extensive investigation with a view toward developing a dry film having excellent various properties. As a result, it has been found that when a curable resin composition comprising a polymer having a number average molecular weight of 1,000 to 1,000,000 and a hardener is used to form a dry film, the film becomes tack-free without semi-curing the film because the polymer is not liquid, so that the dry film can be produced with high productivity by a simple process, and the shelf stability of the dry film is also enhanced. When the dry film is used to produce a build-up multi-layer laminate, forming and processing ability is also enhanced because handling is easy.

The present inventors have further carried out an extensive investigation with a view toward developing a process for efficiently producing a build-up multi-layer laminate, and materials to be used in such a process. As a result, it has been found that when a cycloolefin polymer is used as a resin film of a resin-attached metal foil, the metal foil becomes excellent in chemical resistance and low water absorption property and moreover adhesion property to a plating layer after the formation of a wiring circuit or removal of smear and adhesion property upon build-up laminating can be sufficiently ensured to the resin-attached metal foil, so that the reliability of an insulating layer is enhanced, and the build-up laminating can be conducted with ease because a complicated surface roughening treatment is unnecessary.

According to the present invention, there is thus provided an interlayer insulating material for a high-density assembly board having interlayer-connecting via holes at most 200 μm in diameter, comprising a cycloolefin polymer containing at least 50 mol % of a repeating unit derived from a cycloolefin monomer.

According to the present invention, there is also provided a high-density assembly board having interlayer-connecting via holes at most 200 μm in diameter, wherein an interlayer insulating film of the board comprises a cycloolefin polymer containing at least 50 mol % of a repeating unit derived from a cycloolefin monomer. According to the present invention, there is provided a semiconductor package making use of the high-density assembly board.

According to the present invention, there is further provided a dry film formed from a curable resin composition comprising a polymer having a number average molecular weight within a range of 1,000 to 1,000,000 as measured by gel permeation chromatography, and a hardener. According to the present invention, there is provided a process for producing a dry film, the process comprising the steps of applying the curable resin composition to a substrate and removing an organic solvent under conditions that a curing reaction of the curable resin composition is not caused to completely proceed. According to the present invention, there is provided a laminate comprising an insulating layer formed with the dry film and a conductive layer formed on the surface of the insulating layer. According to the present invention, there are provided a multi-layer laminate further comprising each at least one insulating layer formed with the dry film and conductive layer, wherein the conductive layers are connected to each other by forming interlayer-connecting via holes in the insulating layer provided between them, and a production process thereof.

According to the present invention, there is still further provided a resin-attached metal foil obtained by forming a film of a cycloolefin polymer on one side of a metal foil. According to the present invention, there is provided a laminate obtained by laminating the resin-attached metal foil with the side of the resin film turned inside. According to the present invention, there is provided a process for producing a build-up multi-layer laminate, the process comprising a step (A) of forming a wiring pattern on the metal foil side of the laminate and a step (B) of laminating the resin-attached metal foil on the wiring pattern with the side of the resin film turned inside and then forming a wiring pattern in the same manner as in the step (A), wherein the step (B) is repeated at least once.

The present invention has been led to completion on the basis of these findings.

BEST MODE FOR CARRYING OUT THE INVENTION

[Cycloolefin Polymer]

The cycloolefin polymer useful in the practice of the present invention is a polymer containing a repeating unit derived from a cycloolefin monomer in the whole repeating unit of the polymer. Examples of the cycloolefin monomer include alicyclic monomers having a norbornene ring, monocyclic cycloolefins and cyclic conjugated dienes. These cycloolefin monomers may be used either singly or in any combination thereof, and may be copolymerized with another copolymerizable monomer. The cycloolefin polymer preferably contains a repeating unit derived from the cycloolefin monomer as a principal repeating unit. The repeating unit derived from the cycloolefin monomer includes not only the repeating unit of the cycloolefin, but also modified units of this repeating unit. Modifications include hydrogenation and graft modification by a polar group-containing unsaturated compound.

No particular limitation is imposed on the bonding style of the cycloolefin monomer so far as a cyclic structure can be introduced in a main chain, and it may be either addition polymerization or ring-opening polymerization. Examples of the cycloolefin polymer include:

(1) addition polymers obtained by addition-polymerizing a carbon-carbon unsaturated bond in an alicyclic monomer having a norbornene ring, such as norbornene, ethylidene-norbornene, dicyclopentadiene or tetracyclododecene;

(2) addition copolymers obtained by addition-copolymerizing an alicyclic monomer having a norbornene ring and an unsaturated monomer such as an α-olefin;

(3) addition polymers obtained by addition-polymerizing a carbon-carbon unsaturated bond in a monocyclic cycloolefin such as cyclopentene or cyclohexene;

(4) addition polymers obtained by subjecting a cyclic conjugated diene such as cyclohexadiene to 1,4-addition polymerization;

(5) ring-opening polymers obtained by ring-opening polymerization of an alicyclic monomer having a norbornene ring; and (6) hydrogenated products thereof.

The cycloolefin polymer used in the present invention is preferably excellent in heat resistance. In this respect, the cycloolefin polymer is preferably a thermoplastic norbornene resin, particularly, a thermoplastic saturated norbornene resin such as an addition (co)polymer comprising an alicyclic monomer (i.e., norbornene monomer) having a norbornene ring as a main component, or a hydrogenated product of a ring-opening polymer of the norbornene monomer.

The cycloolefin polymer desirably contains a repeating unit derived from the norbornene monomer in a proportion of generally at least 50 mol %, preferably at least 70 mol %, more preferably at least 80 mol % based on the whole repeating unit of the polymer. The cycloolefin polymer is desirably a polymer having a glass transition temperature (Tg) of generally at least 100° C., preferably at least 120° C., more preferably at least 140° C. as measured by a differential scanning calorimeter (DSC). In the case where higher heat resistance is required, the cycloolefin polymer is a polymer having a Tg of generally at least 160° C., preferably at least 180° C., more preferably at least 200° C. When the glass transition temperature of the cycloolefin polymer falls within the above range, an insulating film formed with the polymer undergoes neither softening nor deformation by heat and pressure upon mounting semiconductor parts on the insulating film, and so such a polymer is preferred.

The molecular weight of the cycloolefin polymer used in the present invention is within a range of 1,000 to 1,000,000, preferably 3,000 to 500,000, more preferably 5,000 to 300,000, most preferably 10,000 to 200,000 when expressed by a number average molecular weight (Mn) in terms of polystyrene as measured by gel permeation chromatography (GPC).

If the number average molecular weight is extremely low, the strength of an insulating film or dry film formed from the cycloolefin polymer is lowered, which forms the cause of cracking. If the number average molecular weight is extremely high on the other hand, the viscosity of the polymer becomes too high, and so its forming or molding ability and processability are deteriorated. It is hence not preferable to use a polymer having such a too low or high molecular weight. When the number average molecular weight falls within the above range, the strength of the resulting insulating film or dry film and the viscosity and processability of the polymer are moderately balanced with each other, and so such a polymer is particularly preferred.

The cycloolefin polymer preferably contains a polar group (functional group) for the purpose of, for example, imparting photosensitivity and enhancing the adhesion property to metal wiring and the like. Methods for introducing the polar group into the cycloolefin polymer include a method of modifying the cycloolefin polymer and a method of (co)polymerizing a cycloolefin monomer having a polar group.

In order to yield excellent property values as an insulating material, the cycloolefin polymer used in the present invention preferably has the following physical property values:

Water Absorptivity:

It is desirable for the cycloolefin polymer to have a water absorptivity of generally at most 1%, preferably at most 0.5%, more preferably at most 0.3%. In a field of which a lower water absorptivity is required, the polymer desirably has a water absorptivity of generally at most 0.1%, preferably at most 0.05%, more preferably at most 0.02%. When the water absorptivity is low, the resulting insulating film is hard to absorb moisture, and so ions in a metal wiring layer is difficult to be dissolved out, and the insulation reliability of the film is enhanced.

Dielectric Constant and Dielectric Loss Tangent:

The dielectric constant of the cycloolefin polymer is generally at most 4.0 as measured at a frequency of 1 MHz. However, in the case where a lower dielectric constant is desired, it is desirable for the polymer to have a water absorptivity of generally at most 3.0, preferably at most 2.5, more preferably at most 2.3. The dielectric loss tangent of the cycloolefin polymer is generally at most 0.1 as measured at a frequency of 1 MHz. However, in a field of which a lower dielectric loss tangent is required, the polymer desirably has a dielectric loss tangent of generally at most 0.01, preferably at most 0.005, more preferably at most 0.0005. Both dielectric constant and a dielectric loss tangent are as low as possible in the stage of the polymer. When these values are small, the transmission rate of data between wiring layers is enhanced, and transmission loss and generation of heat lessen.

[Cycloolefin Monomer]

No particular limitation is imposed on the cycloolefin monomer used as a principal component of the cycloolefin polymer so far as it has a cyclic hydrocarbon compound having a carbon-carbon unsaturated bond. However, the principal monomers include (1) alicyclic monomers (norbornene monomers) having a norbornene ring, (2) monocyclic cycloolefin monomers and (3) cyclic conjugated diene monomers.

(1) Alicyclic Monomer Having a Norbornene Ring:

The alicyclic monomers having a norbornene ring are alicyclic monomers having a norbornene ring described in Japanese Patent Application Laid-Open Nos. 320268/1993 and 36224/1990. These alicyclic monomers having a norbornene ring may be used either singly or in any combination thereof.

The alicyclic monomer having a norbornene ring may be any of (a) a monomer having no other unsaturated bond than a carbon-carbon unsaturated bond participating in a polymerization reaction, (b) a monomer having another unsaturated bond in addition to a carbon-carbon unsaturated bond participating in a polymerization reaction, (c) a monomers having an aromatic ring, and (d) a monomer having a polar group.

(a) Specific examples of the monomer having no other unsaturated bond than a carbon-carbon unsaturated bond participating in a polymerization reaction include bicyclo[2.2.1]hept-2-ene derivatives such as bicyclo[2.2.1]hept-2-ene, 5-methylbicyclo[2.2.1]hept-2-ene, 5-ethylbicyclo[2.2.1]hept-2-ene, 5-butylbicyclo[2.2.1]-hept-2-ene, 5-hexylbicyclo[2.2.1]hept-2-ene and 5-decylbicyclo[2.2.1]hept-2-ene; tetracyclo[$4.4.1^{2,5}.1^{7,10}.0$]-dodec-3-ene derivatives such as tetracyclo[$4.4.1^{2,5}.1^{7,10}.0$]-dodec-3-ene, 8-methyltetracyclo[$4.4.1^{2,5}.1^{7,10}.0$]-dodec-3-ene and 8-ethyltetracyclo[$4.4.1^{2,5}.1^{7,10}.0$]-dodec-3-ene; tricyclo[$4.3.1^{2,5}.0$]-dec-3-ene; and bicyclo[2.2.1]hept-2-ene derivatives having a cyclic substituent group, such as 5-cyclohexylbicyclo[2.2.1]hept-2-ene and 5-cyclopentyl-bicyclo[2.2.1]hept-2-ene.

(b) Specific examples of the monomer having another unsaturated bond in addition to a carbon-carbon unsaturated bond participating in a polymerization reaction include bicyclo[2.2.1]hept-2-ene derivatives having an unsaturated bond outside its ring, such as 5-ethylidenebicyclo[2.2.1]hept-2-ene, 5-vinylbicyclo[2.2.1]-hept-2-ene and 5-propenylbicyclo[2.2.1]hept-2-ene; tetracyclo[$4.4.1^{2,5}.1^{7,10}.0$]-dodec-3-ene derivatives having an unsaturated bond outside its ring, such as 8-methylidenetetracyclo[$4.4.1^{2,5}.1^{7,10}.0$]-dodec-3-ene, 8-ethylidenetetracyclo[$4.4.1^{2,5}.1^{7,10}.0$]-dodec- 3-ene, 8-vinyl-tetracyclo[4.4.1$^{2,5}$.1$^{7,10}$.0]-dodec-3-ene and 8-propenyl-tetracyclo[4.4.1$^{2,5}$.1$^{7,10}$.0]-dodec-3-ene; tricyclo-[4.3.1$^{2,5}$.0]-dec-3,7-diene; and bicyclo[2.2.1]hept-2-ene derivatives having a cyclic substituent group with an unsaturated bond, such as 5-cyclohexenylbicyclo[2.2.1]-hept-2-ene and 5-cyclopentenylbicyclo[2.2.1]-2-ene.

(c) Specific examples of the monomer having an aromatic ring include 5-phenylbicyclo[2.2.1]hept-2-ene, tetracyclo[6.5.1$^{2,5}$.0$^{1,6}$.0$^{8,13}$]tridec-3,8,10,12-tetraene (also referred to as 1,4-methano-1,4,4a,9a-tetrahydrofluorene) and tetracyclo[6.6.1$^{2,5}$.0$^{1,6}$.0$^{8,13}$]tetradec-3,8,10,12-tetraene (also referred to as 1,4-methano-1,4,4a,5,10,10a-hexahydroanthracene).

(d) Specific examples of the monomer having a polar group include bicyclo[2.2.1]hept-2-ene derivatives having at least one substituent group containing an oxygen atom, such as 5-methoxycarbonylbicyclo[2.2.1]hept-2-ene, 5-ethoxycarbonylbicyclo[2.2.1]hept-2-ene, 5-methyl-5-methoxycarbonylbicyclo[2.2.1]hept-2-ene, 5-methyl-5-ethoxycarbonylbicyclo[2.2.1]hept-2-ene, bicyclo-[2.2.1]hept-5-enyl-2-methylpropionate, bicyclo[2.2.1]hept-5-enyl-2-methyloctanoate, bicyclo[2.2.1]hept-2-ene-5,6-dicarboxylic acid anhydride, 5-hydroxymethylbicyclo-[2.2.1]hept-2-ene, 5,6-di(hydroxymethyl)bicyclo-[2.2.1]hept-2-ene, 5-hydroxyisopropylbicyclo[2.2.1]hept-2-ene and 5,6-dicarboxybicyclo[2.2.1]hept-2-ene; tetracyclo-[4.4.1$^{2,5}$.1$^{7,10}$.0]-dodec-3-ene derivatives having at least one substituent group containing an oxygen atom, such as 8-methoxycarbonyltetracyclo[4.4.1$^{2,5}$.1$^{7,10}$.0]-dodec-3-ene, 8-methyl-8-methoxycarbonyltetracyclo[4.4.1$^{2,5}$.1$^{7,10}$.0]-dodec-3-ene, 8-hydroxymethyltetracyclo[4.4.1$^{2,5}$.1$^{7,10}$.0]-dodec-3-ene and 8-carboxytetracyclo[4.4.1$^{2,5}$.1$^{7,10}$.0]-dodec-3-ene; and bicyclo[2.2.1]hept-2-ene derivatives having at least one substituent group containing a nitrogen atom, such as 5-cyanobicyclo[2.2.1]hept-2-ene and bicyclo[2.2.1]hept-2-ene-5,6-dicarboxylic acid imide.

Further, alicyclic monomers having a norbornene ring with an alkyl substituent group having at least 4 carbon atoms may be mentioned in common to all the alicyclic monomers having a norbornene ring.

(2) Monocyclic Cycloolefin Monomer:

The monocyclic cycloolefin monomers are cyclic compounds having a carbon-carbon double bond in their rings. Specific examples thereof include cyclobutene, cyclopentene, cyclohexene and cyclooctene (Japanese Patent Application Laid-Open No. 66216/1989). These monocyclic cycloolefin monomers may be used either singly or in any combination thereof.

(3) Cyclic Conjugated Diene Monomer:

The cyclic conjugated diene monomers are cyclic compounds having a conjugated carbon-carbon double bond in their rings. Specific examples thereof include 1,3-cyclopentadiene, 1,3-cyclohexadiene, 1,3-cycloheptadiene and 1,3-cyclooctadiene (Japanese Patent Application Laid-Open No. 258318/1995). These cyclic conjugated diene monomers are cyclic compounds may be used either singly or in any combination thereof.

In the case where the cycloolefin polymer is an addition (co)polymer, an alicyclic monomer having a norbornene ring with a long-chain alkyl substituent group having at least 4 carbon atoms, such as 6-butylbicyclo-[2.2.1]hept-2-ene, 6-hexylbicyclo[2.2.1]hept-2-ene or 6-decylbicyclo[2.2.1]hept-2-ene, is preferably copolymerized in order to impart flexibility to the resulting material. In the case where the cycloolefin polymer is a ring-opening polymer, an alicyclic monomer having a norbornene ring composed of a heterocycle of at least two rings, such as tetracyclo[4.4.1$^{2,5}$.1$^{7,10}$.0]-dodec-3-ene, 8-methyl-tetracyclo[4.4.1$^{2,5}$.1$^{7,10}$.0]-dodec-3-ene or 8-ethyl-tetracyclo[4.4.1$^{2,5}$.1$^{7,10}$.0]-dodec-3-ene, an alicyclic monomer having a norbornene ring composed of a heterocycle of at least three rings, such as a hexacycloheptadecene monomer, or 1,4-methano-1,4,4a,9a-tetrahydrofluorene is preferably used from the viewpoint of heat resistance.

As unsaturated monomers copolymerizable with the cycloolefin monomer, may be mentioned α-olefins having 2 to 12 carbon atoms, such as ethylene, propylene, 1-butene and 4-methyl-1-pentene; styrene and derivatives thereof such as styrene, α-methylstyrene, p-methylstyrene and p-chlorostyrene; linear conjugated dienes such as 1,3-butadiene and isoprene; vinyl ethers such as ethyl vinyl ether and isobutyl vinyl ether; and carbon monoxide. Such unsaturated monomers are not particularly limited to the above monomers so far as they are copolymerizable with the cycloolefin monomer. In the case where the alicyclic monomer having a norbornene ring is copolymerized with another unsaturated monomer, a vinyl compound such as one of the above-mentioned α-olefins is preferably used as said another unsaturated monomer.

[Polar Group-Containing Cycloolefin Polymer]

The cycloolefin polymer preferably contains a polar group (functional group) for the purpose of, for example, enhancing the adhesion property to a metal conductor layer in particular, imparting photosensitivity, making it possible to cure the polymer by various methods, raising crosslinking density, improving compatibility with other compounding agents, resins and the like, and enhancing heat resistance.

No particular limitation is imposed on the polar group in the polar group-containing cycloolefin polymer used in the present invention so far as it is a polar group which is capable of enhancing the adhesion property to metals and other resin materials and has a function of becoming a curing point upon a curing reaction. Examples thereof include epoxy, carboxyl, hydroxyl, ester, silanol, amino, nitrile, halogeno, acyl and sulfonic groups. Of these, the epoxy, carboxyl, hydroxyl and ester groups are particularly preferred from the viewpoint of making it possible to impart adhesion property and photosensitivity at a low modification rate.

The polar group-containing cycloolefin polymer can be obtained by introducing a polar group such as an epoxy, carboxyl, hydroxyl or ester group into the cycloolefin polymer, for example, in accordance with one of the following three processes:

(1) a process in which a polar group-containing unsaturated compound is added to the cycloolefin polymer by a graft reaction, (2) a process in which a polar group is directly introduced into a carbon-carbon unsaturated bond in the cycloolefin polymer, and (3) a process in which a polar group-containing cycloolefin monomer is copolymerized with the cycloolefin polymer.

The respective processes for introducing a polar group will hereinafter be described in detail.

(1) Graft Reaction of Polar Group-Containing Unsaturated Compound:

The polar group-containing cycloolefin polymer can be obtained by reacting the cycloolefin polymer with a polar group-containing unsaturated compound in the presence of an organic peroxide. No particular limitation is imposed on the polar group-containing unsaturated compound. However, epoxy group-containing unsaturated compounds, carboxyl group-containing unsaturated compounds, hydroxyl group-containing unsaturated compounds, silyl group-containing unsaturated compounds, etc. are preferred because photosensitivity can be imparted in a small amount, and adhesion property can be improved.

Examples of the epoxy group-containing unsaturated compounds include glycidyl esters such as glycidyl acrylate, glycidyl methacrylate and glycidyl p-styryl-carboxylate; mono- or polyglycidyl esters of unsaturated polycarboxylic acids such as endo-cis-bicyclo[2,2,1]hept-5-ene-2,3-dicarboxylic acid and endo-cis-bicyclo[2,2,1]-hept-5-ene-2-methyl-2,3-dicarboxylic acid; unsaturated glycidyl ethers such as allyl glycidyl ether, 2-methyl-allyl glycidyl ether, glycidyl ether of o-allylphenol, glycidyl ether of m-allylphenol and glycidyl ether of p-allylphenol; and 2-(o-vinylphenyl)ethylene oxide, 2-(p-vinylphenyl)ethylene oxide, 2-(o-allylphenyl)ethylene oxide, 2-(p-allylphenyl)ethylene oxide, 2-(o-vinylphenyl)-propylene oxide, 2-(p-vinylphenyl)propylene oxide, 2-(o-allylphenyl)propylene oxide, 2-(p-allylphenyl)propylene oxide, p-glycidylstyrene, 3,4-epoxy-1-butene, 3,4-epoxy-3-methyl-1-butene, 3,4-epoxy-1-pentene, 3,4-epoxy-3-methyl-1-pentene, 5,6-epoxy-1-hexene, vinylcyclohexene monoxide and allyl-2,3-epoxycyclopentyl ether. Of these, the allyl glycidyl esters and allyl glycidyl ethers are preferred, with the allyl glycidyl ethers being particularly preferred, in that such an epoxy group-containing unsaturated compound permits graft addition at a particularly high reaction rate. These epoxy group-containing unsaturated compounds may be used either singly or in any combination thereof.

As examples of the carboxyl group-containing unsaturated compounds, may be mentioned compounds described in Japanese Patent Application Laid-Open No. 271356/1993, such as acrylic acid, methacrylic acid, maleic acid, fumaric acid and itaconic acid. Derivatives of the unsaturated carboxylic acids may also be included in the carboxyl group-containing unsaturated compounds. As examples of the unsaturated carboxylic acid derivatives, may be mentioned halides, amides, imides, anhydrides (for example, maleic anhydride) and esters of unsaturated carboxylic acids.

Examples of the hydroxyl group-containing unsaturated compounds include allyl alcohol, 2-allyl-6-methoxyphenol, 4-allyloxy-2-hydroxybenzophenone, 3-allyloxy-1,2-propanediol, 2-allyldiphenol, 3-buten-1-ol, 4-penten-1-ol and 5-hexen-1-ol.

Examples of the silyl group-containing unsaturated compounds include chlorodimethylvinylsilane, trimethyl-silylacetylene, 5-trimethylsilyl-1,3-cyclopentadiene, 3-trimethylsilylallyl alcohol, trimethylsilyl methacrylate, 1-trimethylsilyloxy-1,3-butadiene, 1-trimethylsilyloxy-cyclopentene, 2-trimethylsilyloxyethyl methacrylate, 2-trimethylsilyloxyfuran, 2-trimethylsilyloxypropene, allyloxy-t-butyldimethylsilane and allyloxytrimethyl-silane.

As the organic peroxide, for example, organic peroxides, organic peresters, etc. may be preferably used. As specific examples of such an organic peroxide, may be mentioned benzoyl peroxide, dichlorobenzoyl peroxide, dicumyl peroxide, di-tert-butyl peroxide, 2,5-dimethyl-2,5-di(peroxide benzoate)hexyne-3, 1,4-bis(tert-butyl peroxyisopropyl)benzene, lauroyl peroxide, tert-butyl peracetate, 2,5-dimethyl-2,5-di(tert-butyl peroxy)hexyne-3, 2,5-dimethyl-2,5-di(tert-butyl peroxy)hexane, tert-butyl perbenzoate, tert-butyl perphenylacetate, tert-butyl perisobutyrate, tert-butyl per-sec-octoate, tert-butyl perpivalate, cumyl perpivalate and tert-butyl perdiethylacetate.

In the present invention, azo compounds may also be used as the organic peroxides. As specific examples of the azo compounds, may be mentioned azobisisobutyronitrile and dimethyl azoisobutyrate.

Of these, benzoyl peroxide, and dialkyl peroxides such as dicumyl peroxide, di-tert-butyl peroxide, 2,5-dimethyl-2,5-di(tert-butyl peroxide)hexyne-3, 2,5-dimethyl-2,5-di(tert-butyl peroxy)hexane and 1,4-bis(tert-butyl peroxyisopropyl)benzene are preferably used as the organic peroxides.

These organic peroxides may be used either singly or in any combination thereof. A proportion of the organic peroxide used is generally within a range of 0.001 to 30 parts by weight, preferably 0.01 to 20 parts by weight, more preferably 0.1 to 10 parts by weight per 100 parts by weight of the unmodified cycloolefin polymer in terms of a charged proportion upon the reaction. The amount of the organic peroxide used within this range is preferred because the reaction rate of the polar group-containing unsaturated compound, and various properties of the resulting polar group-containing polymer, such as water absorptivity and dielectric properties are balanced with one another at a high level.

No particular limitation is imposed on the graft-modifying reaction, and the reaction may be carried out in accordance with a method known per se in the art. The reaction is conducted at a temperature of generally 0 to 400° C., preferably 60 to 350° C. The reaction time is generally within a range of 1 minute to 24 hours, preferably 30 minutes to 10 hours. After completion of the reaction, a poor solvent such as methanol is added in a great amount to the reaction system to deposit a polymer formed, and the polymer is collected by filtration, washed and then dried under reduced pressure, whereby a graft-modified polymer can be obtained.

(2) Direct Modification of Carbon-Carbon Unsaturated Bond:

The polar group-containing cycloolefin polymer can be obtained by introducing a polar group by modifying an olefinic carbon-carbon unsaturated bond in the cycloolefin polymer to add the polar group or by bonding a compound having a polar group to the olefinic carbon-carbon unsaturated bond.

With respect to a process for introducing the polar group, such a process as described in Japanese Patent Application Laid-Open No. 172423/1994 may be used. Specifically, a process in which an epoxy group, carboxyl group, hydroxyl group or the like is introduced by a method of oxidizing the olefinic unsaturated bond, a method of adding a compound having at least one polar group in its molecule to the olefinic unsaturated bond, or the like is mentioned.

(3) Copolymerization of Polar Group-Containing Olefin Monomer:

No particular limitation is imposed on the polar group-containing cycloolefin monomer. However, as examples of the monomer having a polar group, may be mentioned the monomers having a polar group mentioned in (d) in the above description as to the monomers. Of these monomers, monomers having a hydroxyl, carboxyl or ester group, such as 5-hydroxymethylbicyclo[2.2.1]hept-2-ene, 5-hydroxyisopropylbicyclo[2.2.1]hept-2-ene, 5-methoxycarbonyl-bicyclo[2.2.1]hept-2-ene, 8-methoxycarbonyltetracyclo-[4.4.0.1$^{2,5}$.1$^{7,10}$.0]-dodec-3-ene and 5,6-dicarboxybicyclo-[2.2.1]hept-2-ene are preferred from the viewpoint of easy copolymerization. With respect to a catalyst and a polymerization process, a polymerization catalyst and a polymerization process for the alicyclic monomer having a norbornene ring may be used.

(4) Rate of Introduction of Polar Group:

The rate of introduction of the polar group in the polar group-containing cycloolefin polymer is suitably selected as necessary for the end application intended. However, it is generally within a range of 0.1 to 100 mol %, preferably 1 to 50 mol, more preferably 5 to 30 mol % based on the total number of monomer units in the polymer. When the rate of introduction of the polar group in the polar group-containing cycloolefin polymer falls within this range, the water absorptivity, dielectric properties and bond strength to a metal conductor layer are balanced with one another at a high level.

The rate of introduction of the polar group (rate of modification: mol %) is represented by the following equation (1):

$$\text{Rate of introduction of the polar group} = (X/Y) \times 100 \quad (1)$$

wherein

X: (a) the total number of moles of modifying residue introduced by a graft monomer,
  (b) (the total number of moles of unsaturated bond-containing monomer)×(rate of addition of polar group to unsaturated bond), or
  (c) the total number of moles of the polar group-containing monomer
    (all, determined by $^1$H—NMR);

Y: the total number of monomer units in the polymer (weight average molecular weight of the polymer/average molecular weight of the monomer).

[Curable Cycloolefin Polymer Composition]

The cycloolefin polymers used in the present invention can be formulated into curable cycloolefin polymer compositions by adding a hardener thereto. By converting the cycloolefin polymer into a curable type, for example, the following advantages can be obtained. Namely, (1) when it is laminated on a metal foil, a difference in coefficient of linear expansion between the metal foil and the resin layer becomes small, and (2) sufficient heat resistance can be exhibited upon the fabrication of a build-up laminate, mounting of electronic parts and a reliability test. No particular limitation is imposed on the hardener. However, (i) an organic peroxide, (ii) a hardener capable of exhibiting its effect by heat, (iii) a hardener capable of exhibiting its effect by light, or the like is used.

No particular limitation is imposed on the method for curing the curable cycloolefin polymer compositions. For example, the curing can be conducted by using heat, light, radiation and/or the like. The kind of the hardener is suitably selected according to such means. When the addition (co)polymer of the alicyclic monomer having a norbornene ring or the hydrogenated product of the ring-opening (co)polymer has an aromatic ring, the ability to uniformly disperse various hardeners therein becomes good.

Into the curable cycloolefin polymer compositions, a curing aid, a flame retardant, other compounding additives, etc. may be blended in addition to the hardener if desired.

Hardener:

(1) Organic Peroxide:

Examples of the organic peroxide include ketone peroxides such as methyl ethyl ketone peroxide and cyclohexanone peroxide; peroxyketals such as 1,1-bis(t-butyl peroxy)-3,3,5-trimethylcyclohexane and 2,2-bis(t-butyl peroxy)butane; hydroperoxides such as t-butyl hydroperoxide and 2,5-dimethylhexane-2,5-dihydroperoxide; dialkyl peroxides such as dicumyl peroxide, 2,5-dimethyl-2,5-di(t-butyl peroxy)hexyne-3 and α,α'-bis(t-butyl peroxy-m-isopropyl)benzene; diacyl peroxides such as octanoyl peroxide and isobutyryl peroxide; and peroxyesters such as peroxydicarbonate. Of these, the dialkyl peroxides are preferred from the viewpoint of performance of the crosslinked resin. The kind of the alkyl group can be changed according to the curing temperature (forming or molding temperature).

No particular limitation is imposed on the amount of the organic peroxide blended. However, it is used within a range of generally 0.1 to 30 parts by weight, preferably 1 to 20 parts by weight per 100 parts by weight of the cycloolefin polymer from the viewpoints of efficiently conducting a crosslinking reaction, improving the physical properties of the resulting cured polymer, and being profitable. If the blending amount is too little, the resulting composition becomes hard to undergo crosslinking, and so sufficient heat resistance and solvent resistance cannot be imparted to the composition. If the amount is too great on the other hand, the properties of the cured resin, such as water absorption property and dielectric properties are deteriorated. It is hence not preferred to use the organic peroxide in such a too small or great amount. The blending amount within the above range is preferred because these properties are balanced with each other at a high level.

(2) Hardener Capable of Exhibiting its Effect by Heat:

No particular limitation is imposed on the hardener capable of exhibiting its effect by heat so far as it can cause a curing reaction by heating. However, examples thereof include aliphatic polyamines, alicyclic polyamines, aromatic polyamines, bisazides, acid anhydrides, dicarboxylic acids, polyhydric phenols and polyamides.

Specific examples thereof include aliphatic polyamines such as hexamethylenediamine, triethylene-tetramine, diethylenetriamine and tetraethylenepentamine; alicyclic polyamines such as diaminocyclohexane, 3(4),8(9)-bis(aminomethyl)tricyclo[5,2,1,0$^{2,6}$]decane, 1,3-(diaminomethyl)cyclohexane, menthenediamine, isophorone-diamine, N-aminoethylpiperazine, bis(4-amino-3-methyl-cyclohexyl)methane and bis(4-aminocyclohexyl)methane; aromatic polyamines such as 4,4'-diaminodiphenyl ether, 4,4'-diaminodiphenylmethane, α,α'-bis(4-aminophenyl)-1,3-diisopropylbenzene, α,α'-bis(4-aminophenyl)-1,4-diisopropylbenzene, 4,4'-diaminodiphenyl sulfone and m-phenylenediamine; bisazides such as 4,4'-bisazidobenzal-(4-methyl)cyclohexanone, 4,4'-diazidochalcone, 2,6-bis(4'-azidobenzal)cyclohexanone, 2,6-bis(4'-azidobenzal)-4-methylcyclohexanone, 4,4'-diazidodiphenyl sulfone, 4,4'-diazidodiphenylmethane and 2,2'-diazidostilbene; acid anhydrides such as phthalic anhydride, pyromellitic anhydride, benzophenonetetracarboxylic acid anhydride, nadic anhydride, 1,2-cyclohexanedicarboxylic acid, maleic anhydride-modified polypropylene and maleic anhydride-modified cycloolefin resins; dicarboxylic acids such as fumaric acid, phthalic acid, maleic acid, trimellitic acid and himic acid; polyhydric phenols such as phenol novolak resins and cresol novolak resin; and polyamides such as nylon 6, nylon 66, nylon 610, nylon 11, nylon 612, nylon 12, nylon 46, methoxymethylated polyamide, polyhexa-methylenediamine terephthalamide and polyhexamethylene isophthalamide.

These hardeners may be used either singly or in any combination thereof. Of these, the aliphatic polyamines and aromatic polyamines are preferred for reasons of easy uniform dispersion. Further, the aromatic polyamines from the viewpoint of excellent heat resistance, and the polyhydric phenols from the viewpoint of excellent strength properties are particularly preferred. As needed, a hardening accelerator may also be blended to enhance the efficiency of the crosslinking reaction.

No particular limitation is imposed on the amount of the hardener blended. From the viewpoints of being able to efficiently conduct a crosslinking reaction and improve the physical properties of the resulting crosslinked resin, and being profitable, however, it is generally within a range of 0.1 to 30 parts by weight, preferably 1 to 20 parts by weight per 100 parts by weight of the cycloolefin polymer. If the amount of the hardener is too little, the resulting composition becomes hard to undergo crosslinking, and so sufficient heat resistance and solvent resistance cannot be imparted to the composition. To the contrary, any amount too great results in a crosslinked resin lowered in properties such as water absorption property and dielectric properties. It is hence not preferred to use the hardener in any amount outside the above range. The blending amount within the above range is preferred because these properties are balanced with each other at a high level.

As examples of the hardening accelerator, may be mentioned amines such as pyridine, benzyldimethylamine, triethanolamine, triethylamine and imidazoles. The hardening accelerator is added in order to regulate curing rate and further enhance the efficiency of the crosslinking reaction. No particular limitation is imposed on the amount of the hardening accelerator blended. However, it is used within a range of generally 0.1 to 30 parts by weight, preferably 1 to 20 parts by weight per 100 parts by weight of the cycloolefin polymer. The blending amount of the hardening accelerator within this range is preferred because crosslinking density, dielectric properties, water absorptivity and the like of the crosslinked resin are balanced with one another at a high level. Among others, imidazoles are preferred in that a cured resin excellent in dielectric properties can be provided.

(3) Hardener Capable of Exhibiting its Effect by Light:

No particular limitation is imposed on the hardener capable of exhibiting its effect by light so far as it is a photoreactive substance which reacts with the cycloolefin polymer by irradiation of actinic rays such as ultraviolet rays such as g rays, h rays or i rays, far ultraviolet rays, X rays, or electron rays to form a crosslinked compound. However, examples thereof include aromatic bisazide compounds, photo-induced amine generators and photo-induced acid generators.

Specific examples of the aromatic bisazide compounds include 4,4'-diazidochalcone, 2,6-bis(4'-azidobenzal)-cyclohexanone, 2,6-bis(4'-azidobenzal)-4-methyl-cyclohexanone, 4,4'-diazidodiphenyl sulfone, 4,4'-diazidobenzophenone, 4,4'-diazidophenyl, 2,7-diazido-fluorene and 4,4'-diazidophenylmethane. These compounds may be used either singly or in any combination thereof.

Specific examples of the photo-induced amine generators include o-nitrobenzyloxycarbonylcarbamates, 2,6-dinitrobenzyloxycarbonylcarbamates and α,α-dimethyl-3,5-dimethoxybenzyloxycarbonylcarbamates of aromatic amines or aliphatic amines. More specifically, there may be mentioned o-nitrobenzyloxycarbonylcarbamates of aniline, cyclohexylamine, piperidine, hexamethylenediamine, triethylenetetramine, 1,3-(diaminomethyl)cyclohexane, 4,4'-diaminodiphenyl ether, 4,4'-diaminodiphenylmethane, phenylenediamine and the like. These compounds may be used either singly or in any combination thereof.

The photo-induced acid generator is a substance which forms a Brønsted acid or Lewis acid upon exposure to actinic rays. Examples thereof include onium salts, halogenated organic compounds, quinonediazide compounds, α,α-bis(sulfonyl)diazomethane compounds, α-carbonyl-α-sulfonyl-diazomethane compounds, sulfone compounds, organic acid ester compounds, organic acid amide compounds and organic acid imide compounds. These compounds, which cleave upon exposure to the actinic rays to form an acid, may be used either singly or in any combination thereof.

No particular limitation is imposed on the amount of these photoreactive compounds blended. From the viewpoints of being able to efficiently conduct the reaction with the polymer, not impairing the physical properties of the resulting crosslinked resin, and being profitable, however, it is generally within a range of 0.1 to 30 parts by weight, preferably 1 to 20 parts by weight per 100 parts by weight of the cycloolefin polymer. If the amount of the photoreactive substance blended is too little, the resulting composition becomes hard to undergo crosslinking, and so sufficient heat resistance and solvent resistance cannot be imparted to the composition. On the other hand, any amount too great results in a crosslinked resin lowered in properties such as water absorption property and dielectric properties. It is hence not preferable to use the photoreactive compound in any amount outside the above range. The blending amount within the above range is preferred because these properties are balanced with each other at a high level.

Curing Aid:

In the present invention, a curing aid (hardening aid) may be used for the purpose of more enhancing curability and the dispersibility of the compounding additives.

No particular limitation is imposed on the curing aid. Publicly known compounds disclosed in Japanese Patent Application Laid-Open No. 34924/1987 and the like may be used. Examples thereof include oxime.nitroso type curing aids such as quinone dioxime, benzoquinone dioxime and p-nitrosophenol; maleimide type curing aids such as N,N-m-phenylenebismaleimide; allyl type curing aids such as diallyl phthalate, triallyl cyanurate and triallyl isocyanurate; methacrylate type curing aids such as ethylene glycol dimethacrylate and trimethylolpropane trimethacrylate; and vinyl type curing aids such as vinyltoluene, ethylvinylbenzene and divinylbenzene. Of these, the allyl type curing aids and methacrylate type curing aids are preferred because they are easy to be uniformly dispersed.

The amount of the curing aid blended is suitably selected according to the kind of the hardener used. However, it is generally 0.1 to 10 parts by weight, preferably 0.2 to 5 parts by weight per part by weight of the hardener. If the amount of the curing aid blended is too little, the resulting composition becomes hard to undergo curing. On the other hand, any amount too great results in a crosslinked resin having a possibility that its electrical properties, moisture resistance and the like may be deteriorated.

[Compounding Additives]

Various kinds of compounding additives may be added to the cycloolefin polymers and curable cycloolefin polymer compositions according to the present invention if desired.

Flame Retardant:

A flame retardant is not an essential component. However, it is preferred that the flame retardant be added to the cycloolefin polymer composition when the thickness of an interlayer insulating film or dry film formed from the composition becomes great as a whole. No particular limitation is imposed on the flame retardant. However, those which undergo none of decomposition, denaturation and deterioration by the hardener are preferred. Halogen-containing flame retardants are generally used.

Various kinds of chlorine- or bromine-containing flame retardants may be used as the halogen-containing flame retardants. From the viewpoints of flameproofing effect, heat resistance upon forming or molding, dispersibility in resins and influence on the physical properties of the resins, however, the following flame retardants may be preferably used. Namely, preferable examples thereof include hexabromobenzene, pentabromo-ethylbenzene, hexabromobiphenyl, decabromodiphenyl, hexabromodiphenyl oxide, octabromodiphenyl oxide, decabromodiphenyl oxide, pentabromocyclohexane, tetrabromobisphenol A and derivatives thereof [for example, tetrabromobisphenol A-bis(hydroxyethyl ether), tetrabromobisphenol A-bis(2,3-dibromopropyl ether), tetrabromobisphenol A-bis(bromoethyl ether), tetrabromobisphenol A-bis(allyl ether), etc.], tetrabromobisphenol S and derivative thereof [for example, tetrabromobisphenol S-bis(hydroxyethyl ether), tetrabromobisphenol S-bis(2, 3-dibromopropyl ether), etc.], tetrabromophthalic anhydride and derivatives thereof [for example, tetrabromophthalimide, ethylenebistetrabromophthalimide, etc.], ethylenebis(5, 6-dibromonorbornene-2,3-dicarboxyimide), tris-(2,3-dibromopropyl-1) isocyanurate, adducts of hexachlorocyclopentadiene by Diels-Alder reaction, tribromophenyl glycidyl ether, tribromophenyl acrylate, ethylenebistribromophenyl ether, ethylenebis-pentabromophenyl ether, tetradecabromodiphenoxybenzene, brominated polystyrene, brominated polyphenylene oxide, brominated epoxy resins, brominated polycarbonate, polypentabromobenzyl acrylate, octabromonaphthalene, hexabromocyclododecane, bis(tribromophenyl)fumaramide and N-methylhexabromodiphenylamine.

The amount of the flame retardant added is generally 3 to 150 parts by weight, preferably 10 to 140 parts by weight, particularly preferably 15 to 120 parts by weight per 100 parts by weight of the cycloolefin polymer.

As a flame retardant auxiliary for causing the flame retardant to more effectively exhibit its flameproofing effect, for example, an antimonial flame retardant auxiliary such as antimony trioxide, antimony pentoxide, sodium antimonate or antimony trichloride may be used. These flame retardant auxiliaries are used in a proportion of generally 1 to 30 parts by weight, preferably 2 to 20 parts by weight per 100 parts by weight of the flame retardant.

Curable Resin:

In the present invention, a curable resin such as an epoxy resin heretofore used may be blended for the purpose of, for example, improving viscosity characteristics upon heating and melting of a dry film, thereby controlling the viscosity of the dry film upon its heating, melting and press-bonding.

As specific examples of curable resins, may be blended, for example, the conventionally known curable resins such as thermosetting epoxy resins, photosensitive epoxy resins, polyimide resins, photosensitive polyimide resins, bismaleimide.triazine resins, phenol resins and phenol novolak resins.

Other Polymer Components:

In the present invention, rubbery polymers and other thermoplastic resins may be blended into the cycloolefin polymers as needed.

The rubbery polymers are polymers having a glass transition temperature of ordinary temperature (25° C.) or lower and include general rubber-like polymers and thermoplastic elastomers. The Mooney viscosity ($ML_{1+4}$, 100° C.) of such a rubbery polymer is suitably selected as necessary for the end application intended and is generally 5 to 200.

Examples of the rubber-like polymers include ethylene-α-olefin type rubbery polymers; ethylene-α-olefin-polyene terpolymer rubbers; copolymers of ethylene and an unsaturated carboxylic acid ester, such as ethylene-methyl methacrylate copolymers and ethylene-butyl acrylate copolymers; copolymers of ethylene and a fatty acid vinyl ester, such as ethylene-vinyl acetate copolymers; polymers of acrylic acid alkyl esters such as ethyl acrylate, butyl acrylate, hexyl acrylate, 2-ethyl-hexyl acrylate and lauryl acrylate; diene rubbers such as polybutadiene, polyisoprene, styrene-butadiene or styrene-isoprene random copolymers, acrylonitrile-butadiene copolymers, butadiene-isoprene copolymers, butadiene-alkyl (meth)acrylate copolymers, butadiene-alkyl (meth)acrylate-acrylonitrile terpolymers and butadiene-alkyl (meth)acrylate-acrylonitrile-styrene tetrapolymers; and butylene-isoprene copolymers.

As examples of the thermoplastic elastomers, may be mentioned aromatic vinyl-conjugated diene block copolymers such as styrene-butadiene block polymers, hydrogenated styrene-butadiene block copolymers, styrene-isoprene block copolymers and hydrogenated styrene-isoprene block copolymers, low crystalline polybutadiene resins, ethylene-propylene elastomers, styrene-grafted ethylene-propylene elastomers, thermoplastic polyester elastomers, and ethylenic ionomer resins. Of these thermoplastic elastomers, the hydrogenated styrene-butadiene block copolymers and hydrogenated styrene-isoprene block copolymers are preferred. As specific examples thereof, may be mentioned those described in Japanese Patent Application Laid-Open Nos. 133406/1990, 305814/1990, 72512/1991 and 74409/1991, etc.

Examples of the other thermoplastic resins include low density polyethylene, high density polyethylene, linear low density polyethylene, very low density polyethylene, ethylene-ethyl acrylate copolymers, ethylene-vinyl acetate copolymers, polystyrene, poly(phenylene sulfide), poly(phenylene ether), polyamide, polyester, polycarbonate and cellulose triacetate.

These rubbery polymers and other thermoplastic resins may be used either singly or in any combination thereof. The blending amount thereof is suitably selected within limits not impeding the objects of the present invention. However, it is preferably at most 30 parts by weight for reasons of not impeding the properties of the resulting insulating material.

Other Compounding Additives:

To the cycloolefin polymers and curable cycloolefin polymer compositions according to the present invention, may be added proper amounts of other compounding additives such as heat stabilizers, weathering stabilizers, leveling agents, antistatic agents, slip agents, antiblocking agents, anti-fogging agents, lubricants, dyes, pigments, natural oil, synthetic oil, wax and organic or inorganic fillers as needed.

Specific examples thereof include phenolic antioxidants such as tetrakis[methylene-3(3,5-di-t-butyl-4-hydroxyphenyl) propionate]methane, alkyl β-(3,5-di-t-butyl-4-hydroxyphenyl)propionates and 2,2'-oxamidobis-[ethyl-3(3,5-di-t-butyl-4-hydroxyphenyl) propionate]; phosphoric stabilizers such as trisnonylphenyl phosphate, tris(2,4-di-t-butylphenyl) phosphate and tris(2,4-di-t-butylphenyl) phosphate; fatty acid metal salts such as zinc stearate, calcium stearate and calcium 12-hydroxy-stearate; polyhydric alcohol fatty acid esters such as glycerol monostearate, glycerol monolaurate, glycerol distearate, pentaerythritol monostearate, pentaerythritol distearate and pentaerythritol tristearate; synthetic hydrotalcite; amine type antistatic agents; leveling agents for paints, such as fluorine-containing nonionic surfactants, special acrylic resin type leveling agents and silicone type leveling agents; coupling agents such as silane coupling agents, titanate coupling agents, aluminum-containing coupling agents and zircoaluminate coupling agents; plasticizers; and colorants such as pigments and dyes.

As examples of the organic or inorganic fillers, may be mentioned silica, diatomaceous earth, alumina, titanium oxide, magnesium oxide, pumice powder, pumice balloon, basic magnesium carbonate, dolomite, calcium sulfate, potassium titanate, barium sulfate, calcium sulfite, talc, clay, mica, asbestos, glass fibers, glass flake, glass beads, calcium silicate, montmorillonite, bentonite, graphite, aluminum powder, molybdenum sulfide, boron fibers, silicon carbide fibers, polyethylene fibers, polypropylene fibers, polyester fibers and polyamide fibers.

[Interlayer Insulating Material and High-Density Assembly Board]

(1) Varnish and Solvent:

The interlayer insulating material for high-density assembly according to the present invention is generally used in the form of a varnish by dissolving the cycloolefin polymer or curable cycloolefin polymer composition in a solvent.

Examples of the solvent used at this time include aromatic hydrocarbons such as toluene, xylene and ethylbenzene; aliphatic hydrocarbons such as n-pentane, hexane and heptane; alicyclic hydrocarbons such as cyclohexane; and halogenated hydrocarbons such as chlorobenzene, dichlorobenzene and trichlorobenzene.

The solvent is used in an amount sufficient to uniformly dissolve or disperse the cycloolefin polymer and the individual components optionally blended therein. The amount is generally controlled in such a manner that a solids concentration amounts to 1 to 80 wt. %, preferably 5 to 60 wt. %, more preferably 10 to 50 wt. %.

In the present invention, the above-described varnish may also be used in the form of a sheet (film) formed by a solution casting process or a metal foil-attached film by coating a thin metal film such as copper with the varnish. Further, the varnish may be used in the form of a sheet (prepreg) by impregnating a reinforcing base material with the varnish.

(2) High-Density Assembly Board:

The high-density assembly board according to the present invention is a board having via holes at most 200 µm in diameter and an interlayer insulating film formed with the above-described insulating material. In this board, wiring width and wiring pitch (L/S) can be made small by controlling the diameter of each via hole to at most 200 µm, preferably at most 100 µm, more preferably at most 80 µm, most preferably at most 50 µm, thereby mounting semiconductor chips at a high density. In addition, mounting by a bare chip mounting method, i.e., a method of directly connecting electrodes of semiconductor chips to a substrate by gold wires (wire bonding; W.B), or by a method of laminating a chip and a substrate on each other with a solder or conductive adhesive through bumps (flip chip bonding; F.C) is feasible.

The thickness of the interlayer insulating film is generally 5 to 200 µm, preferably 10 to 100 µm, more preferably 20 to 80 µm, most preferably 30 to 50 µm. If the thickness of the insulating film is too thin, a problem arises as to insulation reliability such as migration resistance, and the evenness of the film is lowered. If the thickness of the insulating film is too great, it is difficult to form minute via holes.

(3) Performance of Board:

Heat Resistance:

In the high-density assembly board according to the present invention, LSI chips are mounted by bare chip mounting for the purpose of shortening a wire connecting distance between semiconductor parts and a substrate to promote the speeding up. Mounting methods include wire bonding, flip chip bonding, etc. In the case of the wire bonding, ultrasonic bonding is applied. In the case of the flip chip bonding, high-temperature solder bonding is applied. At this time, the surface temperature of the substrate is raised to 200° C. or higher. Accordingly, when the mechanical strength of an insulating layer at the mounting temperature is greatly lowered, the yield of the bonding is greatly lowered. If a difference between the mounting temperature and the glass transition temperature of a material exceeds 30 to 40° C., the yield greatly increases. Therefore, it is desirable that the glass transition temperature of an interlayer insulating film used in the board be at least 100° C.

Dielectric Properties:

Since the high-density assembly board according to the present invention is particularly used for the purpose of enhancing the processing speed of a computer to achieve speeding up, a central processing unit (CPU) of high clock frequency is mounted. Accordingly, a packaging substrate to be used is also required to have a low dielectric constant so as to sufficiently derive the performance of CPU. Since a wavelength in a high-frequency region is particularly used in communication apparatus, the packaging substrate is required to have a low dielectric loss tangent so as to lessen transmission loss in the high-frequency region. Accordingly, an insulating material forming an interlayer insulating film is also required to have a low dielectric constant and a low dielectric loss tangent. The insulating material according to the present invention has a dielectric constant of at most 4.0 preferably at most 3.0 and a dielectric loss tangent of at most 0.01, preferably at most 0.001 as measured at a frequency of 1 MHz.

Water Absorption Property:

A phenomenon (ion migration) that a metal of a wiring layer is ionized to migrate into an insulating layer is greatly accelerated by water in the insulating layer, resulting in dielectric breakdown. When the water absorptivity of an insulating material is low, the migration resistance of the insulating layer is improved to a great extent, and so the insulation reliability of the board is enhanced to a great extent. The board is also required to have a lower water absorptivity as a whole. According to the present invention, a board having a water absorptivity of at most 0.5%, preferably 0.05% is preferably provided.

(4) Constitution of High-Density Assembly Board:

No particular limitation is imposed on the constitution of the high-density assembly board. However, principal examples thereof include that having a high-density wiring layer built up on at least one side of a substrate and a core substrate having a function as a radiator plate and that obtained by laminating a number of sheets impregnated with a insulating material. Specific typical examples thereof include a SLC board (IBM JAPAN, LIMITED) and an ALIVH multi-layer printed wiring board (Matsushita Electric Industrial Co., Ltd.) described in "Kiyoshi Takagi:

"Trend of MCM Assembly Boards in Recent Years", Journal of Circuit Assembly Society, Vol. 11, No. 5, 1996".

As the core substrate, is used a metal plate, ceramic substrate, silicon wafer substrate, printed wiring substrate or the like. A wiring pattern may also be formed on the core substrate.

(5) Production of High-Density Assembly Board:

Processes for producing a high-density assembly board include ① a process in which an interlayer insulating layer and a metal wiring layer are formed on a core substrate, and ② a process in which a plurality of sheets comprising a reinforcing base material are stacked on one another and hot-pressed.

① Process of Forming Interlayer Insulating Film on Core Substrate:

The process for forming the interlayer insulating film on the core substrate include (a) a build-up (sequential lamination) method in which the above-described insulating material is laminated by a solution coating method such as spin coating or curtain coating, and (b) a laminating method of laminating a plurality of processed sheets on a film to heat and press the resulting laminate.

(a) Build-Up (sequential Lamination) Method:

The interlayer insulating film is formed in accordance with the following process. Namely, the above-described insulating material is applied by a spin coating or curtain coating (casting) method on to the core substrate and pre-baked at about 90 to 100° C. for about 60 seconds to 10 minutes to form a first interlayer insulating film having a film thickness of 3 to 100 µm.

The formation of via holes in the insulating film is conducted in the following manner. When the insulating material is of a thermosetting type, the insulating film is completely cured, and via holes 5 to 150 µm in diameter are then formed by an excimer laser, $CO_2$ laser, UV-YAG laser or the like. When the insulating material is of a photo-setting type, the insulating film is exposed to, for example, ultraviolet light having a wavelength of 365 nm under exposure conditions of about 150 mJ/cm$^2$ using a photomask, developed with an organic solvent such as toluene to form via holes 5 to 150 µm in diameter (photolithographic method), and then completely cured.

The formation of the metal conductor layer is conducted by forming a metal conductor pattern having a conductor width and conductor spacing of 20 to 100 µm, respectively on the insulating film, in which the via holes have been formed.

An interlayer insulating layer comprising 1 to 20 insulating films can be formed by repeating the above-described processes.

(b) Sheet Laminating Method:

In the case of the sheet laminating method, an interlayer insulating film is formed in the following manner. The insulating material is formed into a semi-cured sheet 3 to 100 µm thick in advance by a cast film process.

The sheet is bonded to the above-described core substrate while curing the sheet by hot-pressing using a press or the like. After this, a metal conductor layer is formed in the same manner as in the build-up method except that the formation of interlayer-connecting via holes is conducted by a laser. A second interlayer insulating film is then formed in the same manner as described above. An interlayer insulating layer comprising 1 to 20 insulating films can be formed by repeating the above-described processes.

② Process of Forming Interlayer Insulating Film by Sheets Comprising Reinforcing Base Material:

In the case where the interlayer insulating film is formed by sheets comprising a reinforcing base material, the above-described insulating material is impregnated into a reinforcing base material capable of forming via holes by a laser, and a solution is dried to remove, thereby forming a sheet (prepreg). A plurality of such sheets are stacked on one another while forming a metal conductor pattern in the same manner as in the sheet laminating method, and hot-pressed into a laminate.

In order to form a higher-density multi-layer wiring layer, it is preferred to form the interlayer insulating layer by the build-up method capable of forming minute via holes among the above various processes and methods.

When the cycloolefin polymer has a high glass transition temperature, the above respective interlayer insulating films may be formed without particular curing.

(6) Semiconductor Package:

In the present invention, a semiconductor package can be fabricated in accordance with any publicly known process except that the above high-density assembly board is used. For example, semiconductor parts such as LSI chips are mounted on at least one side of the high-density assembly board by the above-described mounting method, and in particular, a connected part between electrodes of the semiconductor parts and electrodes of the high-density assembly board is sealed with a sealing material such as an epoxy resin. A plurality of electrodes are then arranged by metal wiring on an area of one side (a side on which the number of parts mounted is fewer) of the board on which the semiconductor parts have been mounted, and connecting members, for example, solder balls or the like are provided.

The integral part comprising the semiconductor parts, high-density assembly board and connecting members produced by the above-described process is referred to as a semiconductor package. In particular, packages in which at least two semiconductor parts are mounted are useful in using as multi chip modules (MCM) in computers and communication apparatus. These packages and modules are further connected to a mother board (ordinary printed wiring board) through the above-described connecting members, or may be used as mother board as they are.

When the connecting members are solder balls, they are mounted as a ball grid array (BGA) on computers and communication apparatus.

[Dry Film]

(1) Form of Dry Film:

The dry film is provided in a state that the curable cycloolefin polymer composition (curable resin composition) has been formed into a film by a casting process or the like, and a solvent has been completely removed from the film.

The hardener is uniformly dispersed or dissolved in the curable resin composition. Although the film may be either not cured at all or semi-cured, it is preferred that the film be not cured at all from the viewpoint of improvement in viscosity characteristics in order to heat, melt and press-bond it upon lamination.

No particular limitation is imposed on the thickness of the dry film. However, it is generally 10 to 200 µm, preferably 20 to 100 µm, more preferably 30 to 80 µm. Any thickness too small is not preferred because the insulation reliability of the film is lowered, and difficulties are encountered on its smoothing and build-up laminating. Any thickness too great is also not preferred because there are caused such problems that it is hard to form minute via holes, and residual stress tends to remain. The thickness of the film within the above range is preferred because these properties are balanced with each other at a high level.

No particular limitation is imposed on the process for forming the dry film. However, examples thereof include a process (casting process) in which a varnish comprising the polymer and various other components dissolved or dispersed in a solvent is applied on to a flat substrate and dried, and the like. Examples of the solvent used include aromatic solvents such as benzene, toluene, o-, m- and p-xylene, ethylbenzene, propylbenzene, cumene, butylbenzene, t-butylbenzene, and o-, m- and p-benzonitrile; hydrocarbon solvents such as cyclohexane and decahydronaphthalenen; halogenated solvents such as methylene chloride, chloroform, carbon tetrachloride, ethylene dichloride, chlorobenzene, o-, m- and p-dichlorobenzene, and trichlorobenzene; ether solvents such as tetrahydrofuran (THF), tetrahydropyran, anisole and dimethoxyethane; ketone solvents such as methyl ethyl ketone (MEK), methyl isobutyl ketone (MIBK) and cyclohexanone; and ester solvents such as ethyl acetate, butyl acetate, phenyl acetate and phenyl benzoate. These solvent may be used in combination for the purpose of, for example, controlling drying rate. The resin may also be partially cured in a drying step to control the flowability of the resin in a laminating step.

(2) Multi-Layer Laminate:

The conventionally known process for producing a multi-layer laminate may be applied as a process for producing a laminated board using the dry film according to the present invention as it is. The process will hereinafter be described.

Substrate:

The dry film is first laminated on a substrate (core substrate) serving as a core. No particular limitation is imposed on the substrate. Examples thereof include a double-sided copper-clad laminate substrate, a one-sided copper-clad laminate substrate, a metal substrate, a ceramic substrate and a silicon wafer substrate. A circuit pattern may also be formed in advance on these core substrates.

As a process for forming the pattern on the substrate, there may be used, for example, a process in which the surface of the ceramic or silicon wafer substrate is subjected to sputter cleaning, a film of aluminum in a thickness of up to about 4 μm is formed on at least one side of the substrate by a sputtering method, a film of chromium in a thickness of about 0.15 μm is successively formed thereon to form a passivation film, and chromium and aluminum are then selectively etched to form a first metal wiring. When the core substrate is more generally used, an ordinary glass-epoxy copper-clad laminate substrate is used as a base, and a first wiring layer is also formed in the form of copper wiring having a thickness of ten odd pin on a glass-epoxy copper-clad wiring plate in order of electroless plating and electroplating.

Production of Laminate:

The dry film according to the present invention is laminated on at least one side of the core substrate, whereby a laminate can be produced. The laminating is generally conducted by hot pressing or press bonding under reduced pressure. However, an adhesive may also be used. In the case where particularly high density is required, the thickness of the dry film also thins. Therefore, the press bonding under reduced pressure is preferred to the hot pressing because mixing of bubbles, occurrence of lamination mark, etc. can be prevented. In the case of the press bonding under reduced pressure, a vacuum laminator or the like may preferably be used.

Production Process of Multi-Layer Laminate:

① Build-Up of Dry Film on the Laminate:

The dry film laminated is subjected to curing and formation of interlayer-connecting via holes in the following manner, thereby forming a wiring circuit pattern on the surface, and moreover individual wiring layers are electrically connected to each other in accordance with the following process. After an additional dry film is laminated thereon, a wiring pattern is formed in the same manner as described above. A multi-layer laminate is produced by repeating these processes at least once.

② Curing of the Resin and Formation of Interlayer-Connecting via Holes:

The curable resin composition laminated on the substrate is cured for the purpose of enhancing the heat resistance and reducing the coefficient of linear expansion. The curing of the resin may be conducted either by photo-setting or by heat curing.

(a) Case of Curing by Light:

In the case of curing by light, a mask film is brought into close contact under reduced pressure with the laminate to conduct exposure with ultraviolet light or the like. Exposure conditions are suitably preset according to the properties of the resin and the thickness of the film. After the exposure, development is conducted with a developer suitably selected to form the interlayer-connecting via holes. After the formation of the via holes, it is preferable to conduct curing by ultraviolet light or heat so as to more completely cure the resin.

(b) Case of Curing by Heat:

In the case of a thermosetting (non-photosensitive) dry film, the film is brought into close contact with the laminate and then completely cured by heating. Thereafter, interlayer-connecting via holes are formed by a laser beam. The formation of the via holes by the laser beam is conducted by scanning a laser to chemically decompose the resin. Examples of the laser include excimer laser, carbon dioxide laser, UV-YAG laser, etc. The carbon dioxide laser is principally used.

③ Formation of Conductive Layer (Wiring Circuit Pattern):

As a process for forming a wiring patter, the conventionally known process for forming a wiring pattern on a printed wiring board can be utilized as it is. In general, chemical plating is applied after the formation of the interlayer-connecting via holes. Specifically, after a plating resist is applied, patterning is conducted to form a conductive layer for wiring circuit by a means such as plating (in order of electroless plating and electroplating) or sputtering. At the same time as the formation of the wiring pattern by chemical plating, chemical plating is also applied to wall surfaces of the interlayer-connecting via holes to electrically connect the individual wiring layer to each other.

④ Laminating Process of Dry Film:

No particular limitation is imposed on the process for building up a dry film on the core substrate or the laminate on which another dry film has been laminated. However, examples thereof include hot-roll lamination, hot pressing and vacuum lamination as described above.

Uses:

The build-up multi-layer laminates thus formed are useful, in particular, as high-density assembly boards and semiconductor package boards in fields of information processing such as computers, and information communication of which assembly boards excellent in reliability, heat resistance, dielectric properties, etc. are required.

[Resin-Attached Metal Foil]

(1) Metal Foil:

Any metal foil may be used as a metal foil used in the present invention so far as it can be used as a conductive layer. However, examples thereof include copper foil, aluminum foil, tin foil and gold foil. The copper foil and aluminum foil are preferred from the viewpoint of easy availability and etching, with the copper foil being particularly preferred. The thickness of the metal foil used is generally 1 to 500 μm, preferably 2 to 200 μm, more preferably 5 to 150 μm.

If the thickness of the metal foil is too thin, there is caused a problem that the metal foil is cracked due to a difference in coefficient of linear expansion between a resin layer and the metal foil. If the thickness is too great, it is difficult to form a minute wiring. Of the surfaces of the metal foil, a surface on which a resin layer will be formed may also be subjected to a surface roughening treatment with a chemical or physical treatment, or a coupling treatment for the purpose of enhancing its adhesion property to the resin. A surface roughened electrolytic copper foil sold for production of copper-clad printed wiring board may be used for the resin-attached copper foil according to the present invention as it is.

(2) Build-Up Multi-Layer Laminate:

The conventionally known process for producing a build-up laminate board may be applied as a process for producing a build-up multi-layer board using the resin-attached metal foil according to the present invention as it is. The process will hereinafter be described.

Substrate:

The resin-attached metal foil is first laminated on a substrate (core substrate) serving as a core. No particular limitation is imposed on the substrate. Examples thereof include a double-sided copper-clad laminate substrate, a one-sided copper-clad laminate substrate, a metal substrate, a ceramic substrate and a silicon wafer substrate. A circuit pattern may also be formed in advance on these core substrates.

As a process for forming the pattern on the substrate, there may be used, for example, a process in which the surface of the ceramic or silicon wafer substrate is subjected to sputter cleaning, a film of aluminum in a thickness of up to about 4 μm is formed on at least one side of the substrate by a sputtering method, a film of chromium in a thickness of about 0.15 μm is successively formed thereon to form a passivation film, and chromium and aluminum are then selectively etched to form a first metal wiring. When the core substrate is more generally used, an ordinary glass-epoxy copper-clad laminate substrate is used as a base, and a first wiring layer is also formed in the form of copper wiring having a thickness of ten-odd μm on a glass-epoxy copper-clad wiring plate in order of electroless plating and electroplating.

Production of Laminate:

The resin-attached metal foil according to the present invention is laminated on at least one side of the core substrate with the side of the resin film turned inside, whereby a laminate can be produced. The laminating is generally conducted by hot pressing. However, an adhesive may also be used.

Production Process of Build-Up Multi-Layer Laminate:

① Build-Up of Dry Film on the Laminate:

The resin-attached metal foil laminated is then treated in the following manner. At least part of the metal foil is removed to form a wiring circuit pattern on the metal foil side, and individual wiring layers are electrically connected to each other in accordance with the following process. After an additional resin-attached metal foil is laminated thereon with the side of the resin film turned inside, a wiring pattern is formed in the same manner as described above. A build-up multi-layer laminated board is produced by repeating these processes at least once.

② Curing of the Resin:

The cycloolefin polymer (resin) formed on the metal foil is preferably cured by heat by blending a hardener for the purpose of enhancing the heat resistance and reducing the coefficient of linear expansion.

The heat curing of the cycloolefin polymer may be conducted either at the same time as bonding by heating and pressing or by separate heating after the bonding by heating and pressing. The curing of the polymer may be conducted either upon the build-up laminating or by collectively heating polymer layers after completion of all laminating steps without completely curing it upon the build-up laminating. However, it is preferred to completely cure the polymer upon each build-up laminating in order to enhance the chemical resistance in the formation of a circuit pattern and an etching treatment upon a smear removing treatment.

③ Formation of Wiring Circuit Pattern:

Examples of a process for forming a wiring pattern on the resin-attached metal foil according to the present invention include the following two processes. According to the first process, the resin-attached metal foil is bonded by heating and pressing to the core substrate to cure the resin, and an etching resist is then applied to the metal foil to pattern it. Thereafter, unnecessary parts of the metal foil is removed by an etchant. The wiring circuit pattern formed after separating the etching resist remaining on the wiring pattern is used as a conductor layer as it is, or chemical plating is applied after the formation of interlayer-connecting via holes. According to the second process, after the resin-attached metal foil is similarly bonded by heating and pressing to the core substrate to cure the resin, and the whole metal foil is separated by an etchant, a plating resist is applied, and patterning is then conducted to form a conductive layer for wiring circuit by a means such as plating (in order of electroless plating and electroplating) or sputtering.

④ Laminating Process of Resin-Attached Metal Foil:

No particular limitation is imposed on the process for bonding a resin-attached metal foil by heating and pressing on the core substrate or the build-up multi-layer laminate to which another resin-attached metal foil has been bonded by heating and pressing. However, examples thereof include hot-roll lamination and hot pressing.

Uses:

The build-up multi-layer laminates thus formed are useful, in particular, as high-density assembly boards and semiconductor package boards in fields of information processing such as computers, and information communication of which assembly boards excellent in reliability, heat resistance, dielectric properties, etc. are required.

EXAMPLES

The present invention will hereinafter be described more specifically by the following Preparation Examples, Examples and Comparative Examples. All designations of "part" or "parts" and "%" as will be used in these examples mean part or parts by weight and wt. % unless expressly noted.

Various physical properties were determined in accordance with the following methods:
(1) The glass transition temperature was measured in accordance with the differential scanning calorimetry (DSC method).
(2) The molecular weight was determined in terms of polystyrene as measured by gel permeation chromatography (GPC) using toluene as a solvent unless expressly noted.
(3) The copolymerization ratio was determined by $^1$H—NMR.
(4) The epoxy group content was determined by $^1$H—NMR, and calculated out in accordance with the above-described equation 1.
(5) The carboxyl group content was determined by $^1$H—NMR, and calculated out in accordance with the above-described equation 1.
(6) The hydroxyl group content was determined by $^1$H—NMR, and calculated out in accordance with the above-described equation 1.
(7) The adhesion property to a metal was determined in terms of the 1-cm wide peel strength of a copper plated layer 18 μm thick in accordance with JIS C 6481.
(8) The moisture resistance was evaluated by leaving a test sample to stand for 1,000 hours under conditions of 85° C. and 85% relative humidity and then applying voltage of 1 kV between layers to determine percent defective.
(9) The heat resistance was evaluated by determining yield upon wire-bonding an LSI chip on a build-up board. Any board insufficient in heat resistance is deformed by heat upon the wire bonding, thereby lowing connection yield.
(10) The dielectric constant and dielectric loss tangent were determined at 1 MHz in accordance with JIS K 6911.
(11) The water absorptivity was determined by using a disk-like specimen 50 mm in diameter and 3 mm in thickness produced by a casting process in accordance with JIS K 7209.

Preparation Example 1

(Preparation of Epoxy-Modified Norbornene Copolymer)

<Polymerization>
An addition copolymer of 2-norbornene (NB) and 5-decyl-2-norbornene (DNB) [number average molecular weight (Mn)=69,200, weight average molecular weight (Mw)=132,100, both, in terms of polystyrene; compositional ratio (NB/DNB) of monomers=76/24 (molar ratio); Tg=260° C.] was obtained in accordance with the publicly known process described in U.S. Pat. No. 5,468,819.

<Epoxy Modification>
Dissolved in 130 parts of t-butylbenzene were 28 parts of the thus-obtained norbornene copolymer, 10 parts of 5,6-epoxy-1-hexene and 2 parts of dicumyl peroxide, and a reaction was conducted at 140° C. for 6 hours. A solution of the resultant reaction product was poured into 300 parts of methanol to solidify the reaction product. The epoxy-modified polymer thus solidified was dried under reduced pressure at 100° C. for 20 hours, thereby obtaining 26 parts of an epoxy-modified norbornene copolymer. This resin had Mn of 72,600, Mw of 198,400 and Tg of 265° C. The epoxy group content in the epoxy-modified norbornene copolymer was 2.4% per repeating structural unit of the polymer as measured by $^1$H—NMR. When 15 parts of this epoxy-modified norbornene copolymer and 0.6 parts of 4,4'-bisazidobenzal(4-methyl)cyclohexane as a photoreactive substance were dissolved in 45 parts of xylene, a uniform solution was provided without forming any precipitate.

Preparation Example 2

(Preparation of Epoxy-Modified Norbornene/Ethylene Copolymer)

<Polymerization>
An addition copolymer of NB and ethylene [Mn=66,200, Mw=142,400; compositional ratio (NB/ethylene) of monomers=63/37 (molar ratio); Tg=184° C.] was obtained in accordance with the publicly known process described in Japanese Patent Application Laid-Open No. 292020/1995.

<Epoxy Modification>
Dissolved in 130 parts of t-butylbenzene were 30 parts of the thus-obtained norbornene/ethylene copolymer, 10 parts of 5,6-epoxy-1-hexene and 2 parts of dicumyl peroxide, and a reaction was conducted at 140° C. for 6 hours. A solution of the resultant reaction product was poured into 300 parts of methanol to solidify the reaction product. The epoxy-modified polymer thus solidified was dried under reduced pressure at 100° C. for 20 hours, thereby obtaining 29 parts of an epoxy-modified norbornene/ethylene copolymer. This resin had Mn of 82,400, Mw of 192,300 and Tg of 185° C. The epoxy group content in the epoxy-modified norbornene copolymer was 2.4% per repeating structural unit of the polymer as measured by $^1$H—NMR. When 15 parts of this epoxy-modified norbornene copolymer and 0.6 parts of 4,4'-bisazidobenzal(4-methyl)cyclohexane as a photoreactive substance were dissolved in 45 parts of xylene, a uniform solution was provided without forming any precipitate.

Preparation Example 3

(Preparation of Epoxy-Modified Norbornene Terpolymer)

<Polymerization>
Polymerization was conducted in the same manner as in Preparation Example 1 except that 18 parts of 5-hexyl-2-norbornene (HNB) was used in place of 26 parts of 5-decyl-2-norbornene, and 3 parts of 5-ethylidene-2-norbornene (ENB) were added, thereby obtaining 21 parts of a norbornene terpolymer [Mn=71,100, Mw=107,000; compositional ratio NB/HNB/ENB of monomers=74/23/3 (molar ratio); Tg=323° C.] was obtained.

<Epoxy Modification>
Thirty parts of the thus-obtained norbornene terpolymer were added to 120 parts of toluene and heated to 120° C. into a solution. To the solution were added 1.2 parts of t-butyl hydroperoxide and 0.09 parts of hexacarbonylmolybdenum, and the mixture was refluxed for 2 hours. The reaction mixture was poured into 100 parts of cold methanol to solidify a reaction product. The epoxy-modified polymer thus solidified was dried under reduced pressure at 80° C. for 20 hours, thereby obtaining 30 parts of an epoxy-modified norbornene terpolymer. This epoxy-modified norbornene terpolymer had Mn of 85,200, Mw of 154,600 and Tg of 328° C. The epoxy-modified rate to the unsaturated bonds was 100% as measured by $^1$H—NMR, and the epoxy group content was 3.0% per repeating structural unit of the polymer. When 15 parts of this epoxy-modified norbornene copolymer and 0.6 parts of 4,4'-bisazido-benzal(4-methyl) cyclohexane as a photoreactive substance were dissolved in 45 parts of xylene, a uniform solution was provided without forming any precipitate.

Preparation Example 4

(Maleic Acid-Modified Norbornene Copolymer)

<Maleic Acid Modification>

Thirty parts of the norbornene copolymer obtained in Preparation Example 1 were added to 150 parts of toluene and heated to 120° C. into a solution. To the solution were gradually added a solution of maleic anhydride (3 parts) in toluene (100 parts) and a solution of dicumyl peroxide (0.3 parts) in toluene (45 parts), thereby conducting a reaction for 4 hours. The reaction mixture was poured into 600 parts of cold methanol to solidify a reaction product. The modified polymer thus solidified was dried under reduced pressure at 80° C. for 20 hours, thereby obtaining 30 parts of a maleic acid-modified norbornene copolymer. This resin had Mn of 73,100, Mw of 162,400 and Tg of 266° C. The maleic acid content in the modified polymer was 2.5% per repeating structural unit of the polymer as measured by $^1$H—NMR. When 15 parts of this maleic acid-modified norbornene copolymer, 9 parts of triallyl cyanurate as a crosslinking aid and 1.2 parts of 2,5-dimethyl-2,5-di(t-butyl peroxy)-hexyne-3 as a peroxide were dissolved in 45 parts of xylene, a uniform solution was provided without forming any precipitate.

Preparation Example 5

(Hydroxy-Modified NB/HNB/ENB Terpolymer)

<Hydroxy Modification>

Thirty parts of the norbornene terpolymer obtained in Preparation Example 3 were added to 300 parts of toluene and heated to 120° C. into a solution. To the solution were gradually added dropwise 50 parts of 90% formic acid and 7.5 parts of 30% aqueous hydrogen peroxide, followed by refluxing for 2 hours. The reaction mixture was then neutralized with a methanol solution of sodium hydroxide and poured into 700 parts of acetone to solidify a reaction product. The modified polymer thus solidified was dried under reduced pressure at 80° C. for 20 hours, thereby obtaining 30 parts of a hydroxy-modified norbornene terpolymer. This hydroxy-modified norbornene terpolymer had Mn of 82,100, Mw of 133,400 and Tg of 328° C. The hydroxy-modified rate to the unsaturated bonds was 100% as measured by $^1$H—NMR, and the hydroxy content was 3.0% per repeating structural unit of the polymer. When 15 parts of this hydroxy-modified norbornene terpolymer, 9 parts of triallyl cyanurate and 1.2 parts of 2,5-dimethyl-2, 5-di(t-butyl peroxy)hexyne-3 were dissolved in 45 parts of xylene, a uniform solution was provided without forming any precipitate.

Preparation Example 6

<Polymerization>

Ring-opening polymerization and hydrogenation reaction of methylmethoxytetracyclododecene were conducted in accordance with the publicly known process described in Japanese Patent Application Laid-Open No. 77520/1992 to obtain a hydrogenated product of a ring-opening polymer having a rate of hydrogenation of 100%, a number average molecular weight (Mn) of 16,400 in terms of polystyrene, a weight average molecular weight (Mw) of 58,100 and Tg of 172° C.

When 15 parts of the hydrogenated product of the ring-opening polymer thus obtained, 9 parts of triallyl cyanurate as a crosslinking aid and 1.2 parts of 2,5-dimethyl-2,5-di(t-butyl peroxy)hexyne-3 were dissolved in 45 parts of xylene, a uniform solution was provided without forming any precipitate.

Preparation Example 7

<Polymerization>

Addition polymerization and hydrogenation reaction of cyclohexadiene were conducted in accordance with the publicly known process described in Japanese Patent Application Laid-Open No. 258318/1995 to obtain a polymer having a number average molecular weight (Mn) of 48,300 in terms of polystyrene, a weight average molecular weight (Mw) of 72,200 and Tg of 218° C. The rate of hydrogenation of the resultant hydrogenated product of the cyclic conjugated diene polymer was 85% as determined by $^1$H—NMR.

<Epoxy Modification>

Thirty parts of the thus-obtained hydrogenated product of the cyclic conjugated diene polymer were added to 120 parts of toluene and heated to 120° C. into a solution. To the solution were added 1.2 parts of t-butyl hydroperoxide and 0.09 parts of hexacarbonylmolybdenum, and the mixture was refluxed for 2 hours. The reaction mixture was poured into 300 parts of cold methanol to solidify a reaction product. The epoxy-modified polymer thus solidified was dried under reduced pressure at 80° C. for 20 hours, thereby obtaining 30 parts of an epoxy-modified hydrogenated product of the cyclic conjugated diene polymer. This hydrogenated product of the cyclic conjugated diene polymer had Mn of 68,200, Mw of 122,100 and Tg of 220° C. The epoxy-modified rate to the unsaturated bonds was 100% as measured by $^1$H—NMR, and the epoxy group content was 15% per repeating structural unit of the polymer. When 15 parts of the hydrogenated product of the cyclic conjugated diene polymer and 0.6 parts of 4,4'-bisazidobenzal(4-methyl)cyclohexane as a photoreactive substance were dissolved in 45 parts of xylene, a uniform solution was provided without forming any precipitate.

Preparation Example 8

(Hydrogenated Product of Ring-Opening Polymer)

<Polymerization>

Ring-opening polymerization and hydrogenation of tetracyclododecene and 8-methyltetracyclododecene were conducted in accordance with the publicly known process described in Japanese Patent Application Laid-Open No. 363312/1992 to obtain a hydrogenated product of a ring-opening copolymer having a number average molecular weight (Mn) of 31,200 in terms of polystyrene, a weight average molecular weight (Mw) of 55,800 and Tg of 158° C. The rate of hydrogenation of the resultant polymer was at least 99% as determined by $^1$H—NMR.

<Epoxy Modification>

Dissolved in 130 parts of t-butylbenzene were 28 parts of the thus-obtained hydrogenated product of the ring-opening copolymer, 10 parts of 5,6-epoxy-1-hexene and 2 parts of dicumyl peroxide, and a reaction was conducted at 140° C. for 6 hours. A solution of the resultant reaction product was poured into 300 parts of methanol to solidify the reaction product. The epoxy-modified polymer thus solidified was dried under reduced pressure at 100° C. for 20 hours, thereby obtaining 28 parts of an epoxy-modified hydrogenated product of the ring-opening copolymer. This epoxy-modified hydrogenated product of the ring-opening copolymer had Mn of 38,600, Mw of 85,100 and Tg of 165° C. The epoxy group content in the epoxy-modified hydrogenated product of the ring-opening copolymer was 2.0% per repeating structural unit of the polymer as measured by $^1$H—NMR. When 15 parts of the epoxy-modified hydrogenated product of the ring-opening copolymer and 0.6 parts of 4,4'-bisazidobenzal(4-methyl)cyclohexane as a photoreactive substance were dissolved in 45 parts of xylene, a uniform solution was provided without forming any precipitate.

Preparation Example 9

Addition polymerization of TCD and ethylene was conducted in accordance with the publicly known process described in Japanese Patent Application Laid-Open No. 173112/1990 to obtain an addition polymer [Mn=46,200, Mw=87,500; compositional ratio (TCD/ethylene) of monomers=40/60 (mol %); Tg=143° C.].

Dissolved in 120 parts of cyclohexane were 50 parts of the thus-obtained polymer, 6 parts of 5,6-epoxy-1-hexene and 1.5 parts by weight of dicumyl peroxide, and a reaction was conducted at 150° C. for 1.5 hours in an autoclave. A solution of the resultant reaction product was poured into 240 parts of isopropyl alcohol to solidify the reaction product. The reaction product thus solidified was then dried under reduced pressure at 100° C. for 20 hours to obtain 50 parts by weight of an epoxy group-containing norbornene copolymer. This epoxy group-containing norbornene copolymer had Mn of 55,400, Mw of 100,600 and Tg of 148° C. The epoxy group content in the epoxy group-containing norbornene copolymer was 1.2% per repeating structural unit of the polymer as measured by $^1$H—NMR.

When 15 parts of the thus-obtained epoxy group-containing norbornene copolymer and 0.6 parts of 4,4'-bisazidobenzal(4-methyl)cyclohexane as a photoreactive substance were dissolved in 45 parts of xylene, a uniform solution was provided without forming any precipitate.

The monomer constitution, molecular weight, polar group and rate of modification of each of the resins obtained in Preparation Examples 1 to 9 are shown in Table 1.

TABLE 1

| | Base polymer(*1) | Comp. ratio of monomers (molar ratio) | Mn | Mw | Tg (° C.) | Polar group | Rate of modification (mol %) | Mn | Mw | Tg (° C.) |
|---|---|---|---|---|---|---|---|---|---|---|
| Prep. Ex. 1 | NB/DNB | 76/24 | 69,200 | 132,100 | 260 | Epoxy | 2.4 | 72,600 | 198,400 | 265 |
| Prep. Ex. 2 | NB/Ethylene | 63/37 | 66,200 | 142,400 | 184 | Epoxy | 2.4 | 82,400 | 192,300 | 185 |
| Prep. Ex. 3 | NB/HNB/ENB | 74/23/3 | 71,100 | 107,000 | 323 | Epoxy | 3.0 | 85,200 | 154,600 | 328 |
| Prep. Ex. 4 | NB/DNB | 76/24 | 69,200 | 132,100 | 260 | Carboxyl | 2.5 | 73,100 | 162,400 | 266 |
| Prep. Ex. 5 | NB/HNB/ENB | 74/23/3 | 71,100 | 107,000 | 323 | Hydroxyl | 3.0 | 82,100 | 133,400 | 328 |
| Prep. Ex. 6 | Methoxymethyl-TCD | 100 | 18,500 | 48,700 | — | Carbonyl | 100.0 | 19,400 | 58,100 | 172 |
| Prep. Ex. 7 | Cyclohexadiene | 100 | 48,300 | 72,200 | 218 | Epoxy | 15.0 | 68,200 | 122,100 | 220 |
| Prep. Ex. 8 | TCD/MethylTCD | 46/54 | 31,200 | 55,800 | 158 | Epoxy | 2.0 | 38,600 | 85,100 | 165 |
| Prep. Ex. 9 | TCD/Ethylene | 40/60 | 46,200 | 87,500 | 143 | Epoxy | 1.2 | 55,400 | 100,600 | 148 |

(Note)
NB: Norbornene,
DNB: Decylnorbornene,
HNB: Hexylnorbornene,
ENB: Ethylidenenorbornene,
TCD: Tetracyclododecene.

Example 1

<Formation of Interlayer Insulating Film>

The uniform solution obtained in Preparation Example 1 was filtered through a precision filter made of polytetrafluoroethylene (PTFE) having a pore size of 0.22 μm to obtain a curable polymer composition. The solution thus obtained was coated on a glass-epoxy 4-layer substrate by means of a spinner, and then prebaked at 80° C. for 90 seconds to form a coating film (insulating layer) having a film thickness of 40 μm. The coating film was exposed to ultraviolet light having light intensity of 150 mJ/cm$^2$ at 365 nm using a test pattern mask for formation of via holes and then developed with cyclohexane to form via holes 50 μm in diameter. The thus-treated coating film was then cured by heating at 220° C. for 4 hours under nitrogen in an oven. After the whole surface of the coating film was then plated with copper to form a copper layer 15 μm thick, a resist was applied thereto, exposed using a mask for wiring pattern and then developed.

The thus-treated copper layer was etched by immersing the substrate in an aqueous solution of ammonium persulfate, and the resist was separated to obtain a laminate in which copper wiring had been formed. The above steps, i.e., ① the coating of the interlayer insulating layer, ② the formation of the via holes, and ③ the formation of the copper wiring layer, were repeated to obtain a 3-layer laminated wiring circuit board. With respect to the laminate thus obtained, the via hole-forming ability, dielectric properties, water absorptivity, heat resistance, adhesion property to copper wiring and moisture resistance were determined. The results are shown in Table 2.

Example 2

A 3-layer laminated wiring circuit board was formed in the same manner as in Example 1 except that the uniform solution obtained in Preparation Example 2 was used, and was evaluated. The results are shown in Table 2.

Example 3

A 3-layer laminated wiring circuit board was formed in the same manner as in Example 1 except that the uniform solution obtained in Preparation Example 3 was used, and was evaluated. The results are shown in Table 2.

Example 4

The uniform solution obtained in Preparation Example 4 was filtered through a precision filter made of PTFE having a pore size of 0.22 μm to obtain a curable polymer composition. The solution thus obtained was coated on a glass-epoxy 4-layer substrate by means of a spinner, and then prebaked at 80° C. for 90 seconds to form a coating film (insulating layer) having a film thickness of 40 μm. After the coating film was further heated at 220° C. for 4 hours to completely cure it, via holes 50 μm in diameter were formed therein using a UV-YAG laser. After the whole surface of the coating film was then plated with copper to form a copper layer 15 μm thick, a resist was applied thereto, exposed using a mask for wiring pattern and then developed. The thus-treated copper layer was etched by immersing the substrate in an aqueous solution of ammonium persulfate, and the resist was separated to obtain a laminate in which copper wiring had been formed. The above steps, i.e., ① the coating of the interlayer insulating layer, ② the formation of the via holes, and ③ the formation of the copper wiring layer, were repeated to obtain a 3-layer laminated wiring circuit board. With respect to the laminate thus obtained, the via hole-forming ability, dielectric properties, water absorptivity, heat resistance, adhesion property to copper wiring and moisture resistance were determined. The results are shown in Table 2.

Example 5

A 3-layer laminated wiring circuit board was formed in the same manner as in Example 4 except that the uniform solution obtained in Preparation Example 5 was used, and a carbon dioxide laser was used in the formation of via holes 50 μm in diameter, and was evaluated. The results are shown in Table 2.

Example 6

A 3-layer laminated wiring circuit board was formed in the same manner as in Example 4 except that the uniform solution obtained in Preparation Example 6 was used, and was evaluated. The results are shown in Table 2.

Example 7

A 3-layer laminated wiring circuit board was formed in the same manner as in Example 1 except that the uniform solution obtained in Preparation Example 7 was used, and was evaluated. The results are shown in Table 2.

Example 8

A 3-layer laminated wiring circuit board was formed in the same manner as in Example 1 except that the uniform solution obtained in Preparation Example 8 was used, and was evaluated. The results are shown in Table 2.

Comparative Example 1

(Formation of Photosensitive Polyimide Interlayer Insulating Film)

A solution of polyamic acid, into the carboxyl group of which an ester bond had been introduced, was coated on a silicon wafer by means of a spinner, and then prebaked at 80° C. for 90 seconds to form a coating film (insulating layer) having a film thickness of 40 μm. The coating film was exposed to ultraviolet light of 300 mJ/cm$^2$ using a test pattern mask for formation of via holes and then developed with an alkali to form via holes 50 μm in diameter. The thus-treated coating film was heat-treated at 350° C. for 3 hours under nitrogen in an oven, thereby imidating it by dehydration ring-closing reaction. Thereafter, the same process as in Example 1 was followed to obtain a laminate. With respect to the laminate thus obtained, the via hole-forming ability, dielectric properties, water absorptivity, heat resistance, adhesion property to copper wiring and moisture resistance were determined. The results are shown in Table 2.

Comparative Example 2

(Photosensitive Epoxy Resin Insulating Varnish)

An insulating varnish for formation of photo-via holes comprising, as a main component, a bisphenol type epoxy resin, to which photosensitivity had been imparted by acryl modification, was coated on a glass-epoxy 4-layer substrate by spin coating, and then prebaked at 80° C. for 90 seconds to form a coating film (insulating layer) having a film thickness of 40 μm. Thereafter, the same process as in Comparative Example 1 except that the curing temperature was changed to 150° C. was followed to obtain a laminate. With respect to the laminate thus obtained, the via hole-forming ability, dielectric properties, water absorptivity, heat resistance, adhesion property to copper wiring and moisture resistance were determined. The results are shown in Table 2.

Comparative Example 3

The uniform solution obtained in Preparation Example 9 was filtered through a precision filter made of PTFE having a pore size of 0.22 μm to obtain a curable polymer composition. A multi-layer laminated wiring circuit board was fabricated in the same manner as in Example 1 except that curing was conducted at 150° C. for 3 hours under nitrogen upon the formation of the interlayer insulating film, and was evaluated. The results are shown in Table 2.

violet light having light intensity of 300 mJ/cm² at 365 nm using a UV irradiation device to completely cure the resin at the exposed portion. Thereafter, development was conducted with a mixed solution of toluene/cyclohexane to dissolve and remove the uncured portion of the resin,

TABLE 2

|  | Wiring density L/S (μm/μm) | Via hole diameter(μm) | Via hole forming ability | Heat resistance, W.B yield (%) | Water absorptivity (%) | Moisture resistance (percent defective) (%) | Dielectric constant (1 MHz) | Dielectric loss tangent (1 MHz) | Wiring peeling strength (kg/cm²) |
|---|---|---|---|---|---|---|---|---|---|
| Ex. 1 | 80/80 | 50 | Good | >90 | 0.05 | 0.0 | 2.5 | 0.0007 | >1.0 |
| Ex. 2 | 80/80 | 50 | Good | >85 | 0.05 | 0.0 | 2.5 | 0.0007 | >1.0 |
| Ex. 3 | 80/80 | 50 | Good | >90 | 0.06 | 0.0 | 2.6 | 0.0008 | >1.1 |
| Ex. 4 | 80/80 | 50 | Good | >90 | 0.05 | 0.0 | 2.5 | 0.0007 | >1.0 |
| Ex. 5 | 80/80 | 50 | Good | >90 | 0.06 | 0.0 | 2.6 | 0.0008 | >1.1 |
| Ex. 6 | 80/80 | 50 | Good | >85 | 0.08 | 0.0 | 2.8 | 0.0012 | >1.2 |
| Ex. 7 | 80/80 | 50 | Good | >90 | 0.07 | 0.0 | 2.7 | 0.0010 | >1.1 |
| Ex. 8 | 80/80 | 50 | Good | >80 | 0.05 | 0.0 | 2.5 | 0.0007 | >1.2 |
| Comp. Ex. 1 | 80/80 | 50 | (*1) | >90 | 0.30 | 2.0 | 3.2 | 0.0300 | >1.2 |
| Comp. Ex. 2 | 80/80 | 50 | (*2) | <60 | 0.25 | 4.0 | 4.0 | 0.1500 | >1.2 |
| Comp. Ex. 3 | 80/80 | 50 | Good | <50 | 0.05 | 0.0 | 2.4 | 0.0070 | >1.0 |

(Note)
(*1) Form failure due to swelling at the bottom of a wall surface;
(*2) A wall surface was dissolved at the bottom thereof.

Example 9

A high-density assembly board was fabricated in the same manner as in Example 4 except that the unmodified norbornene copolymer in Preparation Example 1 was used in place of the epoxy-modified norbornene copolymer obtained in Preparation Example 1, and triallyl cyanurate and 2,5-dimethyl-2,5-di(t-butyl peroxy)hexyne-3 were used as a crosslinking aid and a peroxide, respectively, and was evaluated. As a result, good results were exhibited except that the wiring peeling strength in the evaluation of the adhesion property to the wiring was lowered to 0.8 kg/cm².

Example 10

<Formation of Dry Film>

The uniform solution obtained in Preparation Example 1 was filtered through a precision filter made of PTFE having a pore size of 0.22 μm to obtain a curable polymer composition. The solution thus obtained was coated on a glass substrate 18 μm in thickness in the form of a rectangle of 50 mm×80 mm by means of a spinner, and then prebaked at 80° C. for 90 seconds to remove the solvent, thereby forming a dry film having a film thickness of 40 μm.

<Formation of Build-Up Multi-Layer Laminate>

(A) After a glass-epoxy multi-layer wiring substrate 600 μm thick, which is a base material, was sandwiched between 2 dry films obtained in the above-described manner to press-bond the dry films under reduced pressure to the substrate by means of a vacuum laminator, they were heated, melted and bonded by a hot press, thereby producing a laminate. The heating was conducted for 2 minutes at a temperature higher by 20° C. than the glass transition temperature of the copolymer.

(B) After mask films for formation of via holes were press-bonded under reduced pressure to both sides of the laminate obtained above, the laminate was exposed to ultra-thereby forming interlayer-connecting via holes. After a proper surface-roughening treatment was conducted on the surfaces of the dry films in which the via holes had been formed, plating resist films were applied to the surfaces to form chemical copper plating layers in order of electroless plating and electroplating. The resist films were then separated to form metal wiring patterns.

(C) Additional dry films were laminated on both sides of the dry film-attached laminate, on which the metal wiring patterns had been formed, in the same manner as in the step (A), and the curing of the resin, formation of the via holes and formation of the metal wiring patterns were conducted in the same manner as in the step (B). The process of (C) was repeated three times in total to form a build-up multilayer laminate having 4 layers on each side. The dielectric properties and water absorptivity of the thus-obtained laminate were determined. As a result, good values were obtained as demonstrated by a dielectric constant of 2.5 and a dielectric loss tangent of 0.0007 with respect to the dielectric properties, and a water absorptivity of 0.05%. In the evaluation as to moisture resistance as well, excellent reliability was demonstrated by a percent defective of at most 3%.

Example 11

A build-up multi-layer laminate was formed in the same manner as in Example 10 except that the uniform solution obtained in Preparation Example 2 was used, and was evaluated. As a result, excellent evaluation results were obtained as demonstrated by a dielectric constant of 2.5, a dielectric loss tangent of 0.0007, a water absorptivity of 0.05% and a percent defective of at most 3% in the evaluation as to moisture resistance.

Example 12

A build-up multi-layer laminate was formed in the same manner as in Example 10 except that the uniform solution obtained in Preparation Example 3 was used, and was evaluated. As a result, excellent evaluation results were obtained as demonstrated by a dielectric constant of 2.6, a dielectric loss tangent of 0.0008, a water absorptivity of 0.06% and a percent defective of at most 5% in the evaluation as to moisture resistance.

Example 13

<Formation of Dry Film>

The uniform solution obtained in Preparation Example 2 was filtered through a precision filter made of PTFE having a pore size of 0.22 μm to obtain a curable polymer composition. The solution thus obtained was coated on a glass substrate 18 μm in thickness in the form of a rectangle of 50 mm×80 mm by means of a spinner, and then prebaked at 80° C. for 90 seconds to remove the solvent, thereby forming a dry film having a film-thickness of 40 μm.

<Formation of Build-Up Multi-Layer Laminate>

(A) After a glass-epoxy multi-layer wiring substrate 600 μm thick, which is a base material, was sandwiched between 2 dry films obtained in the above-described manner to press-bond the dry films under reduced pressure to the substrate by means of a vacuum laminator, they were heated, melted and bonded by a hot press, thereby producing a laminate. The heating was conducted for 2 minutes at a temperature higher by 50° C. than the glass transition temperature of the copolymer.

(B) The laminate obtained above was heated at 200° C. for 4 hours under nitrogen in an oven to completely cure the dry film layers. Thereafter, interlayer-connecting via holes were formed by means of a carbon dioxide laser scanning apparatus. After a proper surface-roughening treatment was then conducted on the surfaces of the dry films in which the via holes had been formed, plating resist films were applied to the surfaces to form chemical copper plating layers in order of electroless plating and electroplating. The resist films were then separated to form metal wiring patterns.

(C) Additional dry films were laminated on both sides of the dry film-attached laminate, on which the metal wiring patterns had been formed, in the same manner as in the step (A), and the curing of the resin, formation of the via holes and formation of the metal wiring patterns were conducted in the same manner as in the step (B). The process of (C) was repeated three times in total to form a build-up multilayer laminate having 4 layers on each side. The dielectric properties and water absorptivity of the thus-obtained laminate were determined. As a result, excellent evaluation results were obtained as demonstrated by a dielectric constant of 2.5, a dielectric loss tangent of 0.0007, a water absorptivity of 0.05% and a percent defective of at most 3% in the evaluation as to moisture resistance.

Example 14

A build-up multi-layer laminate was formed in the same manner as in Example 11 except that the uniform solution obtained in Preparation Example 5 was used, and was evaluated. As a result, excellent evaluation results were obtained as demonstrated by a dielectric constant of 2.6, a dielectric loss tangent of 0.0008, a water absorptivity of 0.06% and a percent defective of at most 5% in the evaluation as to moisture resistance.

Example 15

A build-up multi-layer laminate was formed in the same manner as in Example 11 except that the uniform solution obtained in Preparation Example 6 was used, and was evaluated. As a result, excellent evaluation results were obtained as demonstrated by a dielectric constant of 2.8, a dielectric loss tangent of 0.0012, a water absorptivity of 0.08% and a percent defective of at most 8% in the evaluation as to moisture resistance.

Example 16

A build-up multi-layer laminate was formed in the same manner as in Example 10 except that the uniform solution obtained in Preparation Example 7 was used, and was evaluated. As a result, excellent evaluation results were obtained as demonstrated by a dielectric constant of 2.7, a dielectric loss tangent of 0.0010, a water absorptivity of 0.07% and a percent defective of at most 7% in the evaluation as to moisture resistance.

Example 17

A build-up multi-layer laminate was formed in the same manner as in Example 10 except that the uniform solution obtained in Preparation Example 8 was used, and was evaluated. As a result, excellent evaluation results were obtained as demonstrated by a dielectric constant of 2.5, a dielectric loss tangent of 0.0007, a water absorptivity of 0.05% and a percent defective of at most 6% in the evaluation as to moisture resistance.

Comparative Example 4

(Production Example of Build-Up Multi-Layer Laminate of Photosensitive Epoxy Resin)

(A) A laminate with a layer laminated on each side of a substrate was formed in the same manner as in Example 10 except that dry films (alkali development type; film thickness: 50 μm) of the conventionally known photosensitive epoxy resin were used, and the heating and press bonding were conducted at 160° C. for 2 minutes.

<Formation of Build-Up Multi-Layer Laminate>

(B) After mask films for formation of via holes were press-bonded under reduced pressure to both sides of the laminate obtained above, the laminate was exposed to ultraviolet light having light intensity of 300 mJ/cm$^2$ at 365 nm using a UV irradiation device to completely cure the resin at the exposed portion. Thereafter, development was conducted with a methyl isobutyl ketone solution to dissolve and remove the uncured portion of the resin, thereby forming interlayer-connecting via holes. After a proper surface-roughening treatment was conducted on the surfaces of the dry films in which the via holes had been formed, plating resist films were applied to the surfaces to form chemical copper plating layers in order of electroless plating and electroplating. The resist films were then separated to form metal wiring patterns.

(C) Additional dry films were laminated on both sides of the dry film-attached laminate, on which the metal wiring patterns had been formed, in the same manner as in the step (A), and the curing of the resin, formation of the via holes and formation of the metal wiring patterns were conducted in the same manner as in the step (B). The process of (C) was repeated three times in total to form a build-up multilayer laminate having 4 layers on each side. The viscosity characteristics (flowability) of the dry films upon the heating and press bonding were deteriorated by the influence that curing proceeded before the laminating since the shelf stability of the dry films was poor, so that the adhesion properties between the film and the substrate and between the films were lowered. The dielectric properties and water absorptivity of the thus-obtained laminate were determined. As a result, with respect to the dielectric properties, the dielectric constant was 4.1 and the dielectric loss tangent was 0.12, while the water absorptivity was 0.4%. As the result that the evaluation as to moisture resistance was conducted, it was found that the percent defective was increased to 13% due to migration resulting from the fact that interlayer moisture absorption was accelerated because the adhesion property between the films was lowered for the above-described reasons. [Comparative Example 5]

(Production Example of Build-Up Multi-Layer Laminate of Non-Photosensitive Epoxy Resin)

(A) A laminate with a layer laminated on each side of a substrate was formed in the same manner as in Example 13 except that dry films (thermosetting type; film thickness: 50 μm) of the conventionally known non-photosensitive epoxy resin were used, and the heating and press bonding were conducted at 160° C. for 2 minutes.

<Formation of Build-Up Multi-Layer Laminate>

(B) The laminate obtained above was heated at 180° C. for 3 hours under nitrogen in an oven to completely cure the dry film layers. Thereafter, interlayer-connecting via holes were formed by means of a carbon dioxide laser scanning apparatus. After a proper surface-roughening treatment was then conducted on the surfaces of the dry films in which the via holes had been formed, plating resist films were applied to the surfaces to form chemical copper plating layers in order of electroless plating and electroplating. The resist films were then separated to form metal wiring patterns.

(C) Additional dry films were laminated on both sides of the dry film-attached laminate, on which the metal wiring patterns had been formed, in the same manner as in the step (A), and the curing of the resin, formation of the via holes and formation of the metal wiring patterns were conducted in the same manner as in the step (B). The process of (C) was repeated three times in total to form a build-up multilayer laminate having 4 layers on each side. The viscosity characteristics (flowability) of the dry films upon the heating and press bonding were deteriorated by the influence that curing proceeded before the laminating since the shelf stability of the dry films was poor like Comparative Example 4, so that the adhesion properties between the film and the substrate and between the films were lowered. The dielectric properties and water absorptivity of the thus-obtained laminate were determined. As a result, with respect to the dielectric properties, the dielectric constant was 3.8 and the dielectric loss tangent was 0.09, while the water absorptivity was 0.4%. As the result that the evaluation as to moisture resistance was conducted, it was found that the percent defective was increased to 12% due to migration resulting from the fact that interlayer moisture absorption was accelerated because the adhesion property between the films was lowered for the above-described reasons.

Example 18

<Formation of Resin-Attached Metal Foil>

The uniform solution obtained in Preparation Example 1 was filtered through a precision filter made of PTFE having a pore size of 0.22 μm to obtain a curable polymer composition. The solution thus obtained was coated on a roughened surface of a rolled copper foil 18 μm in thickness in the form of a rectangle of 50 mm×80 mm by means of a spinner, and then prebaked at 80° C. for 90 seconds to form a coating film (insulating layer) having a film thickness of 0.40 μm.

<Formation of Build-Up Multi-Layer Laminate>

A glass-epoxy multi-layer wiring substrate 600 μm thick, which is a base material, was sandwiched (with the resin side of the resin-attached metal foil turned inside) between 2 cycloolefin resin-attached metal foils obtained in the above-described manner to bond the metal foils by heating them under pressure of 50 kg/cm$^2$ at a temperature higher by 50° C. than the glass transition temperature (Tg) of the modified polymer for 1 to 5 minutes in a nitrogen atmosphere by means of a hot press, thereby producing a laminate. Parts of the copper foils were etched using masks to form spots for formation of via holes, followed by formation of via holes 50 μm in diameter by means of a carbon dioxide laser. Thereafter, the laminate was heated at 200° C. for 4 hours under nitrogen in an oven to completely cure the resin films. Etching resists for formation of wiring pattern were then applied to the copper foils, and the thus-treated substrate was immersed in an aqueous solution of ammonium persulfate to etch copper. Further, resin smear remaining at the bottom of each via hole was removed (desmearing treatment) with a permanganate solution. After the resists were separated, wall surfaces of the via holes and copper wiring layers were plated with copper to conduct interlayer connection. The thus-obtained build-up laminate was further sandwiched between 2 resin-attached metal foil. Thereafter, the above-described process was repeated to obtain a build-up multi-layer laminate having 3 layers on each side, i.e., 6 layers in total on both sides. The dielectric properties and water absorptivity of the thus-obtained laminate were determined. As a result, good values were obtained as demonstrated by a dielectric constant of 2.5 and a dielectric loss tangent of 0.0007 with respect to the dielectric properties, and a water absorptivity of 0.05%. In the evaluation as to moisture resistance as well, excellent reliability was demonstrated by a percent defective of at most 3%.

Example 19

A build-up multi-layer laminate was formed in the same manner as in Example 18 except that the uniform solution obtained in Preparation Example 2 was used, and was evaluated. As a result, excellent evaluation results were obtained like Example 18 as demonstrated by a dielectric constant of 2.5, a dielectric loss tangent of 0.0007, a water absorptivity of 0.05% and a percent defective of at most 3% in the evaluation as to moisture resistance.

Example 20

A build-up multi-layer laminate was formed in the same manner as in Example 18 except that the uniform solution obtained in Preparation Example 3 was used, and was evaluated. As a result, excellent evaluation results were obtained as demonstrated by a dielectric constant of 2.6, a dielectric loss tangent of 0.0008, a water absorptivity of 0.06% and a percent defective of at most 5% in the evaluation as to moisture resistance.

Example 21

A build-up multi-layer laminate was formed in the same manner as in Example 18 except that the uniform solution obtained in Preparation Example 4 was used, and was evaluated. As a result, excellent evaluation results were obtained as demonstrated by a dielectric constant of 2.5, a dielectric loss tangent of 0.0007, a water absorptivity of 0.05% and a percent defective of at most 3% in the evaluation as to moisture resistance.

Example 22

A build-up multi-layer laminate was formed in the same manner as in Example 18 except that the uniform solution obtained in Preparation Example 5 was used, and was evaluated. As a result, excellent evaluation results were obtained as demonstrated by a dielectric constant of 2.6, a dielectric loss tangent of 0.0008, a water absorptivity of 0.06% and a percent defective of at most 5% in the evaluation as to moisture resistance.

Example 23

A build-up multi-layer laminate was formed in the same manner as in Example 18 except that the uniform solution obtained in Preparation Example 6 was used, and was evaluated. As a result, excellent evaluation results were obtained as demonstrated by a dielectric constant of 2.8, a dielectric loss tangent of 0.0012, a water absorptivity of 0.08% and a percent defective of at most 8% in the evaluation as to moisture resistance.

Example 24

A build-up multi-layer laminate was formed in the same manner as in Example 18 except that the uniform solution obtained in Preparation Example 7 was used, and was evaluated. As a result, excellent evaluation results were obtained as demonstrated by a dielectric constant of 2.7, a dielectric loss tangent of 0.0010, a water absorptivity of 0.07% and a percent defective of at most 7% in the evaluation as to moisture resistance.

Example 25

A build-up multi-layer laminate was formed in the same manner as in Example 18 except that the uniform solution obtained in Preparation Example 8 was used, and was evaluated. As a result, excellent evaluation results were obtained as demonstrated by a dielectric constant of 2.5, a dielectric loss tangent of 0.0007, a water absorptivity of 0.05% and a percent defective of at most 6% in the evaluation as to moisture resistance.

Preparation Example 10

(Synthesis of Maleic Anhydride-Modified PPE)

After 100 parts of poly(2,6-dimethyl-1,4-phenylene ether), 1.5 parts of maleic anhydride and 1.0 part of 2,5-dimethyl-2,5-di(t-butyl peroxy)hexane (Perhexa 25B, product of Nippon Oil & Fats Co., Ltd.) were dry blended at room temperature, the blend was extruded from a twin-screw extruder under conditions of a cylinder temperature of 300° C. and a screw speed of 230 rpm to obtain maleic anhydride-modified poly(phenylene ether) (PPE). When 15 parts of the thus-obtained PPE, 9 parts of triallyl cyanurate as a curing aid and 1.2 parts of 2,5-dimethyl-2,5-di(t-butyl peroxy)hexyne-3 were dissolved in 45 parts of hot toluene, a uniform solution was provided without forming any precipitate.

Comparative Example 6

(Preparation of Thermosetting PPE Resin-Attached Metal Foil)

A resin-attached metal foil and a build-up multi-layer laminate were prepared in exactly the same manner as in Example 18 except that the PPE resin composition obtained in Preparation Example 10, and evaluated. As a result, the roughened wall surface of each via hole was slightly dissolved by the chemical treatments upon the formation of wiring and desmearing treatment, so that the adhesion property to the plating layer was deteriorated, and the reliability on the moisture resistance test was greatly lowered due to migration. Therefore, the percent defective was increased to at least 20%.

From the above-described Examples 18 to 25 and Comparative Example 6, it was confirmed that the build-up multi-layer laminates produced with the resin-attached metal foils making use of the cycloolefin resin composition exhibit excellent dielectric properties, low water absorption property and reliability.

INDUSTRIAL APPLICABILITY

According to the present invention, there are provide interlayer insulating materials for high-density assembly boards, which are particularly suitable for use in bare chip mounting of LSI chips and are capable of forming minute via holes. According to the present invention, there are also provided high-density assembly boards making use of such an interlayer insulating material having excellent properties. The insulating materials and high-density assembly boards according to the present invention are excellent in electrical properties such as dielectric constant and dielectric loss tangent, moisture resistance and durability, and are also excellent in adhesion properties to metal layers and substrates. The interlayer insulating materials according to the present invention are useful in a wide variety of fields, in particular, as assembly circuit boards and the like, of which high density and high reliability are required, in fields of electric and electronic apparatus.

According to the present invention, there are also provided dry films excellent in shelf stability, adhesion properties and reliability, which are particularly suitable for use in interlayer insulating films for high-density assembly boards. According to the present invention, there are further provided build-up multi-layer laminates making use of such dry films and a production process thereof. The dry films according to the present invention are excellent in electrical properties such as dielectric constant and dielectric loss tangent, and moisture resistance and are useful in a wide variety of fields, in particular, as interlayer insulating materials for assembly boards, and the like, of which speeding up and high reliability are required, in fields of electric and electronic apparatus.

According to the present invention, there are further provided resin-attached metal foils excellent in adhesion properties and reliability, which are particularly suitable for use in interlayer insulating films for high-density assembly boards. According to the present invention, there are provided build-up multi-layer laminates making use of such resin-attached metal foils, and a production process thereof. The resin-attached metal foils according to the present invention are excellent in electrical properties such as dielectric constant and dielectric loss tangent, and moisture resistance and are useful in a wide variety of fields, in particular, as interlayer insulating materials for assembly boards, and the like, of which speeding up and high reliability are required, in fields of electric and electronic apparatus.

The invention claimed is:

1. A dry film formed from a curable resin composition comprising
    (a) a cycloolefin polymer containing a polar group, wherein the polar group is selected from the group consisting of a carboxyl group and a hydroxyl group and the rate of introduction of the polar group in the cycloolefin polymer is within a range of 0.1–100 mol % based on the total number of units in the polymer, and at least 50 mol % of a repeating unit derived from a cycloolefin monomer, and having a number average molecular weight within a range of 1,000 to 1,000,000 as measured by gel permeation chromatography, and
  (b) a hardener selected from the group consisting of an organic peroxide and a hardener capable of exhibiting its effect by heat.

2. The dry film according to claim 1, wherein the cycloolefin polymer has a glass transition temperature of at least 100° C. as measured by a differential scanning calorimeter.

3. The dry film according to claim 1, wherein the cycloolefin polymer has a carboxyl polar group.

4. The dry film according to claim 1, wherein the curable resin composition is a varnish further comprising an organic solvent.

5. The dry film according to claim 1, wherein the cycloolefin polymer has a hydroxyl polar group.

6. The dry film according to claim 1, wherein the rate of introduction of the polar group in the cycloolefin polymer is within a range of 1 to 50 mol %.

7. The dry film according to claim 1, wherein the rate of introduction of the polar group in the cycloolefin polymer is within a range of 5 to 30 mol %.

8. The dry film according to claim 1, wherein the cycloolefin polymer contains at least 70 mol % of a repeating unit derived from a cycloolefin monomer.

9. The dry film according to claim 1, wherein the cycloolefin polymer contains at least 80 mol % of a repeating unit derived from a cycloolefin monomer.

10. The dry film according to claim 2, wherein the cycloolefin polymer has a glass transition temperature of at least 140° C. as measured by a differential scanning calorimeter.

11. The dry film according to claim 2, wherein the cycloolefin polymer has a glass transition temperature of at least 180° C. as measured by a differential scanning calorimeter.

12. The dry film according to claim 1, wherein the cycloolefin polymer has a number average molecular weight within a range of 3000 to 500,000.

13. The dry film according to claim 1, wherein the cycloolefin polymer has a number average molecular weight within a range of 10,000 to 200,000.

14. A process for producing a dry film, the process comprising the steps of applying a curable resin composition comprising
  (a) a cycloolefin polymer containing a polar group, wherein the polar group is selected from the group consisting of a carboxyl group and a hydroxyl group and the rate of introduction of the polar group in the cycloolefin polymer is within a range of 0.1–100 mol % based on the total number of units in the polymer, and at least 50 mol % of a repeating unit derived from a cycloolefin monomer, and having a number average molecular weight within a range of 1,000 to 1,000,000 as measured by gel permeation chromatography,
  (b) a hardener selected from the group consisting of an organic peroxide and a hardener capable of exhibiting its effect by heat, and
  (c) an organic solvent,
to a substrate and removing the organic solvent under conditions that a curing reaction of the curable resin composition is not caused to completely proceed.

15. A laminate comprising an insulating layer formed with a dry film formed from a curable resin composition comprising
  (a) a cycloolefin polymer containing a polar group, wherein the polar group is selected from the group consisting of a carboxyl group and a hydroxyl group and the rate of introduction of the polar group in the cycloolefin polymer is within a range of 0.1–100 mol % based on the total number of units in the polymer, and at least 50 mol % of a repeating unit derived from a cycloolefin monomer, and having a number average molecular weight within a range of 1,000 to 1,000,000 as measured by gel permeation chromatography, and
  (b) a hardener selected from the group consisting of an organic peroxide and a hardener capable of exhibiting its effect by heat, and
a conductive layer formed on the surface of the insulating layer.

16. A multi-layer laminate comprising at least two laminates according to claim 15, with the insulating layer of the second laminate formed with the dry film formed on the conductive layer of the first laminate, wherein the conductive layers are connected to each other by interlayer-connecting via holes in the insulating layer provided between them.

17. The multi-layer laminate according to claim 16, wherein at least one via hole has a diameter of, at most, 200 μm.

18. The multi-layer laminate according to claim 16, wherein the via holes have a diameter of, at most, 200 μm.

19. A process for producing a multi-layer laminate, which comprises a step (A) of laminating a dry film formed from a curable resin composition comprising
  (a) a cycloolefin polymer containing a polar group, wherein the polar group is selected from the group consisting of a carboxyl group and a hydroxyl group and the rate of introduction of the polar group in the cycloolefin polymer is within a range of 0.1–100 mol % based on the total number of units in the polymer, and at least 50 mol % of a repeating unit derived from a cycloolefin monomer, and having a number average molecular weight within a range of 1,000 to 1,000,000 as measured by gel permeation chromatography, and
  (b) a hardener selected from the group consisting of an organic peroxide and a hardener capable of exhibiting its effect by heat
on at least one side of a substrate, conducting the curing of the dry film and the formation of interlayer-connecting via holes, and then forming a conductive layer on the surface of the dry film and wall surfaces of the via holes to produce a laminate, and a step (B) of laminating an additional dry film on the conductive layer-forming surface of the laminate and conducting the curing of the additional dry film, forming interlayer-connecting via holes and forming a conductive layer on the additional dry film in the same manner as in the step (A), wherein the step (B) is repeated at least once.

20. The process for producing a multi-layer laminate according to claim 19, wherein the via holes have a diameter of, at most, 200 μm.

* * * * *